(12) United States Patent
Isaka et al.

(10) Patent No.: US 7,985,604 B2
(45) Date of Patent: Jul. 26, 2011

(54) METHOD OF MANUFACTURING PHOTOELECTRIC CONVERSION DEVICE

(75) Inventors: Fumito Isaka, Kanagawa (JP); Sho Kato, Kanagawa (JP); Kosei Nei, Kanagawa (JP); Ryu Komatsu, Kanagawa (JP); Akihisa Shimomura, Kanagawa (JP); Koji Dairiki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 251 days.

(21) Appl. No.: 12/324,065

(22) Filed: Nov. 26, 2008

(65) Prior Publication Data

US 2009/0142908 A1  Jun. 4, 2009

(30) Foreign Application Priority Data

Nov. 30, 2007  (JP) ................... 2007-310817

(51) Int. Cl.
*H01L 21/00*  (2006.01)
(52) U.S. Cl. ............... 438/22; 438/48; 438/57; 257/21; 257/53; 257/E33.001; 257/E31.001
(58) Field of Classification Search ............... 438/22, 438/48, 57; 257/21, 53, 108, 184
See application file for complete search history.

(56) References Cited

U.S. PATENT DOCUMENTS

| | | | |
|---|---|---|---|
| 4,180,618 A | 12/1979 | Alpha et al. | |
| 4,496,788 A | 1/1985 | Hamakawa et al. | |
| 4,633,034 A | 12/1986 | Nath et al. | |
| 4,727,047 A | 2/1988 | Bozler et al. | |
| 4,816,420 A | 3/1989 | Bozler et al. | |
| 5,371,037 A | 12/1994 | Yonehara | |
| 5,665,607 A | 9/1997 | Kawama et al. | |
| 5,736,431 A | 4/1998 | Shinohara et al. | |
| 5,750,000 A | 5/1998 | Yonehara et al. | |
| 5,811,348 A | 9/1998 | Matsushita et al. | |
| 5,840,616 A | 11/1998 | Sakaguchi et al. | |
| 5,854,123 A | 12/1998 | Sato et al. | |
| 6,190,937 B1 | 2/2001 | Nakagawa et al. | |
| 6,331,208 B1 | 12/2001 | Nishida et al. | |

(Continued)

FOREIGN PATENT DOCUMENTS

JP  6044638 B  6/1994

(Continued)

*Primary Examiner* — Hsien-ming Lee
(74) *Attorney, Agent, or Firm* — Fish & Richardson P.C.

(57) ABSTRACT

A photoelectric conversion device having an excellent photoelectric conversion characteristic is provided while effectively utilizing limited resources. A fragile layer is formed in a region at a depth of less than 1000 nm from one surface of a single crystal semiconductor substrate, and a first impurity semiconductor layer, a first electrode, and an insulating layer are formed on the one surface side of the single crystal semiconductor substrate. After bonding the insulating layer to a supporting substrate, the single crystal semiconductor substrate is separated with the fragile layer or its vicinity used as a separation plane, thereby forming a first single crystal semiconductor layer over the supporting substrate. A second single crystal semiconductor layer is formed by epitaxially growing a semiconductor layer on the first single crystal semiconductor layer in accordance with a plasma CVD method in which a silane based gas and hydrogen with a flow rate 50 times or more that of the silane gas are used as a source gas. A second impurity semiconductor layer which has a conductivity type opposite to that of the first impurity semiconductor layer is formed over the second single crystal semiconductor layer. A second electrode is formed over the second impurity semiconductor layer.

21 Claims, 25 Drawing Sheets

U.S. PATENT DOCUMENTS

| | | |
|---|---|---|
| 6,372,609 B1 | 4/2002 | Aga et al. |
| 6,380,046 B1 | 4/2002 | Yamazaki |
| 6,387,829 B1 | 5/2002 | Usenko et al. |
| 6,534,380 B1 | 3/2003 | Yamauchi et al. |
| 6,566,277 B1 | 5/2003 | Nakagawa et al. |
| 6,605,518 B1 | 8/2003 | Ohmi et al. |
| 6,656,271 B2 | 12/2003 | Yonehara et al. |
| 6,692,981 B2 | 2/2004 | Takato et al. |
| 6,818,529 B2 | 11/2004 | Bachrach et al. |
| 7,674,647 B2 * | 3/2010 | Arai ................................ 438/57 |
| 7,858,431 B2 | 12/2010 | Isaka et al. |
| 2004/0056332 A1 | 3/2004 | Bachrach et al. |
| 2008/0099065 A1 | 5/2008 | Ito et al. |
| 2008/0160661 A1 | 7/2008 | Henley |
| 2008/0245406 A1 | 10/2008 | Yamazaki et al. |
| 2008/0251126 A1 * | 10/2008 | Yamazaki et al. ............ 136/261 |
| 2008/0296724 A1 * | 12/2008 | Yamazaki et al. ............ 257/506 |
| 2009/0120498 A1 * | 5/2009 | Yamazaki et al. ............ 136/258 |
| 2009/0127555 A1 * | 5/2009 | Yamazaki et al. .............. 257/51 |

FOREIGN PATENT DOCUMENTS

| | | |
|---|---|---|
| JP | 10093122 A | 4/1998 |
| JP | 10335683 A | 12/1998 |
| JP | 11097379 A | 4/1999 |
| JP | 11163363 A | 6/1999 |
| JP | 2000150940 A | 5/2000 |
| JP | 2002348198 A | 12/2002 |
| JP | 2005268682 A | 9/2005 |

* cited by examiner

METHOD OF MANUFACTURING PHOTOELECTRIC CONVERSION DEVICE

BACKGROUND OF THE INVENTION

1. Field of the Invention

The present invention relates to a photoelectric conversion device including single crystal semiconductor or polycrystalline semiconductor and to a manufacturing method of the photoelectric conversion device.

2. Description of the Related Art

The industrial growth has been boosting energy consumption worldwide. The mainly used energy such as oil, coal, and natural gas produces a large amount of carbon dioxide, which has been a factor of drastic global warming in recent years. In response to that, photovoltaic power generation which produces less amount of carbon oxide and is eco-friendly is getting popular.

Some photovoltaic power generation utilize solar heat, while many others employ photoelectric conversion devices (also called solar cells or photoelectromotive devices) by which light energy is converted into electric energy with use of the photoelectric characteristic of semiconductor.

Photoelectric conversion devices are already available in the market and the production thereof has been expanding year by year also with government support for solar cells around the world. For example, the production of solar cells around the world in 2006 is 2521 MW, which has increased by more than 40% per annum. Above all, photoelectric conversion devices including crystalline semiconductor have become popular worldwide, and a large part of the production is occupied by the devices including single crystal silicon substrates or polycrystalline silicon substrates.

As for a crystalline photoelectric conversion device using silicon as a material, a thickness of about 10 μm is enough to absorb sunlight. However, a single crystal silicon wafer used in the product has a diameter of 6 inches (150 mm) to 12 inches (300 mm) and a thickness of 600 μm to 800 μm, whereas a polycrystalline silicon wafer used in the product has a length of 100 mm to 150 mm on each side and a thickness of 200 μm to 350 μm. That is to say, the thickness of a single crystal silicon substrate or a polycrystalline silicon substrate is several tens times or more the necessary thickness of a photoelectric conversion device and the substrate, which is a material, is not used effectively at present. In an extreme case, when a single crystal silicon substrate or a polycrystalline silicon substrate is used in a photoelectric conversion device, most part of the substrate only functions as a structure body that keeps the shape of the photoelectric conversion device.

With the increase in production of photoelectric conversion devices year by year, short of supply and rise of cost of silicon, which is the material of single crystal silicon or polycrystalline silicon, have become significant problems of the industry. As for the supply-demand balance of polycrystalline silicon, which had been excess in supply reflecting semiconductor recession, polycrystalline silicon is now short of supply since around fiscal 2005 due to drastic expansion of the solar cell market in addition to the recovery of semiconductor (LSI) industry. Major silicon suppliers in the world have already tried to increase capability of silicon production, though the increase in demand outweighs the capability and the short of supply seems to continue for some time.

A variety of structures of photoelectric conversion devices have been disclosed. In addition to a photoelectric conversion device having a typical structure in which a single crystal silicon substrate or a polycrystalline silicon substrate is provided with an n-type or a p-type diffusion layer, a stacked type photoelectric conversion device in which different kinds of unit cells are combined is known (see Patent Document 1: Examined Patent Application Publication No. H6-044638). This stacked type photoelectric conversion device has a combination of a unit cell including single crystal semiconductor or polycrystalline semiconductor and a unit cell including amorphous semiconductor or microcrystal semiconductor. However, the photoelectric conversion device as aforementioned also needs to use a single crystal semiconductor substrate or a polycrystalline semiconductor substrate.

In recent years, development has been actively conducted on an SOI (silicon on insulator) structure which includes a single crystal silicon thin film formed over a substrate having an insulating surface. Although an SOI substrate is expensive, the cost can be decreased as compared with a bulk single crystal silicon substrate as long as an inexpensive substrate such as a glass substrate can be used as a supporting substrate. Moreover, the consumption of silicon, which is the material, can be decreased. For example, a method of manufacturing an SOI substrate in which a single crystal silicon layer is fixed to a glass substrate by a hydrogen ion implantation separation method is known (for example, see Patent Document 2: Japanese Published Patent Application No. H11-097379).

SUMMARY OF THE INVENTION

When a hydrogen ion implantation separation method is employed, a single crystal silicon thin film which is homogeneous can be formed through a low-temperature process as compared with when a SIMOX substrate or a bonding substrate utilizing grinding or polishing is used. Furthermore, a single crystal silicon substrate from which a single crystal silicon thin film has been separated can be reused, which can achieve effective utilization of resources.

In the case of manufacturing a photoelectric conversion device with use of an SOI substrate, a single crystal silicon thin film needs to have large thickness to some extent in order to effectively absorb sunlight. As for solar cells, a single crystal silicon thin film with a thickness of at least 800 nm is necessary in consideration of photoelectric conversion efficiency. In the case of employing a hydrogen ion implantation separation method, the depth of ion implantation in a single crystal silicon substrate is determined depending on the acceleration voltage of an ion implantation apparatus. Based on the depth of ion implantation, the film thickness of a single crystal silicon thin film is determined. However, the acceleration voltage of an ion implantation apparatus has limitation from the aspect of the apparatus, so that there is the upper limit of the depth of ion implantation in a single crystal silicon substrate. Moreover, in order to increase the depth of ion implantation, it is necessary to increase the acceleration voltage at the time of ion implantation. However, it was difficult for a conventional apparatus to obtain a large amount of current by increasing the acceleration voltage. Therefore, when the acceleration voltage is increased, a long period of time is necessary in order to obtain a predetermined implantation amount, which results in that the takt time might decrease.

In view of the aforementioned problems, it is an object of the present invention to provide a photoelectric conversion device having an excellent photoelectric conversion characteristic and its manufacturing method, while effectively utilizing limited resources.

A semiconductor layer of a photoelectric conversion device is formed utilizing an epitaxial growth technique by a chemical vapor deposition (CVD) method typified by a plasma chemical vapor deposition method (hereinafter referred to as a plasma CVD method). In the present invention, a single crystal semiconductor layer formed over a supporting substrate is epitaxially grown to increase the thickness of the single crystal semiconductor layer. The single crystal semiconductor layer before the epitaxial growth can be obtained by slicing a single crystal semiconductor substrate.

The epitaxial growth of the single crystal semiconductor layer is performed by a plasma CVD method with a mixed gas of a silane based gas and hydrogen used as a source gas. As the silane based gas, silane is typically given. The epitaxial growth of the semiconductor layer is performed using a source gas including hydrogen with a flow rate 50 times or more, preferably 100 times or more that of the silane based gas, that is, a source gas in which the silane based gas is diluted with hydrogen.

In the plasma CVD method, plasma is preferably generated by applying a high-frequency electric power or a microwave electric power in vacuum. Here, the vacuum refers to the state of or under atmospheric pressure, preferably 1 Pa or more and $10^3$ Pa or less. As for the high-frequency electric power, the electric power frequency is 10 MHz to 200 MHz, typically 13.56 MHz or 60 MHz. As for the microwave electric power, the electric power frequency is 1 GHz to 5 GHz, typically 2.45 GHz.

In an aspect of a method of manufacturing a photoelectric conversion device according to the present invention, a fragile layer is formed in a region at a depth of less than 1000 nm from one surface of a single crystal semiconductor substrate, and a first impurity semiconductor layer, a first electrode, and an insulating layer are formed on the one surface side of the single crystal semiconductor substrate. After bonding the insulating layer to a supporting substrate, the single crystal semiconductor substrate is separated with the fragile layer or the vicinity of the fragile layer used as a cleavage plane, thereby forming a first single crystal semiconductor layer over the supporting substrate. A second single crystal semiconductor layer is formed by epitaxially growing a semiconductor layer on the first single crystal semiconductor layer in accordance with a plasma CVD method in which a silane based gas and hydrogen with a flow rate 50 times or more that of the silane gas are used as a source gas. A second impurity semiconductor layer which has a conductivity type opposite to that of the first impurity semiconductor layer is formed over the second single crystal semiconductor layer. A second electrode is formed over the second impurity semiconductor layer.

It is to be noted that "cleavage" in this specification refers to separation of a single crystal semiconductor substrate at a fragile layer or the vicinity of the fragile layer. Further, "separation plane" refers to a plane formed by separating a single crystal semiconductor substrate at a fragile layer or the vicinity of the fragile layer.

In an aspect of a method of manufacturing a photoelectric conversion device according to the present invention, a fragile layer is formed in a region at a depth of less than 1000 nm from one surface of a single crystal semiconductor substrate, and a first impurity semiconductor layer, a first electrode, and an insulating layer are formed on the one surface side of the single crystal semiconductor substrate. After bonding the insulating layer to a supporting substrate, the single crystal semiconductor substrate is separated with the fragile layer or the vicinity of the fragile layer used as a separation plane, thereby forming a first single crystal semiconductor layer over the supporting substrate. A second single crystal semiconductor layer is formed by epitaxially growing a semiconductor layer on the first single crystal semiconductor layer in accordance with a plasma CVD method in which a silane based gas and hydrogen with a flow rate 50 times or more that of the silane based gas are used as a source gas. A second impurity semiconductor layer is formed by epitaxially growing a semiconductor layer on the second single crystal semiconductor layer in accordance with a plasma CVD method in which a silane based gas, hydrogen with a flow rate 50 times or more that of the silane based gas, and a doping gas including an impurity element imparting one conductivity type are used as a source gas. A second electrode is formed over the second impurity semiconductor layer.

As the doping gas, a gas including an impurity imparting p type conductivity or a gas including an impurity imparting n type conductivity can be used. In specific, diborane ($B_2H_6$) can be used as the doping gas imparting p type conductivity and phosphine ($PH_3$) can be used as the doping gas imparting n type conductivity.

In any of the above structures, the fragile layer is preferably formed using ions or cluster ions generated from a source gas including hydrogen, and is preferably formed by irradiating the single crystal semiconductor substrate with ions which are accelerated by voltage without mass separation. Further, the proportion of $H_3^+$ ions with respect to the total amount of the ions or cluster ions to be irradiated is preferably large.

In any of the above structures, the total thickness of the first single crystal semiconductor layer and the second single crystal semiconductor layer is preferably 800 nm or more.

In any of the above structures, the first single crystal semiconductor layer can be formed to have p type conductivity by using a p type single crystal semiconductor substrate as the single crystal substrate, while the second single crystal semiconductor layer can be formed to be intrinsic by epitaxially growing the first single crystal semiconductor layer with use of a source gas including no doping gas. Moreover, the first impurity semiconductor layer can have p type conductivity, while the second impurity semiconductor layer can have n type conductivity.

It is to be noted that "intrinsic semiconductor (i type semiconductor)" in this specification refers to a semiconductor which is intrinsic or substantially intrinsic, and indicates a semiconductor which has an impurity element imparting one conductivity type (an impurity element imparting p type conductivity or n type conductivity) at a concentration of $1 \times 10^{20}/cm^3$ or less and oxygen and nitrogen each at a concentration of $9 \times 10^{19}/cm^3$ or less and which has photoconductivity of 100 times or more the dark conductivity. An intrinsic semiconductor may include boron at 1 ppm to 1000 ppm. An intrinsic semiconductor sometimes has weak n type conductivity when an impurity element for controlling valence electrons is not added intentionally. Therefore, an impurity element imparting p type conductivity is added at the same time as or after the film formation, in some cases. The impurity element imparting p type conductivity is typically boron, and an impurity gas such as $B_2H_6$ or $BF_3$ may be mixed into a semiconductor material gas at a ratio of 1 ppm to 1000 ppm. The concentration of boron may be, for example, $1 \times 10^{14}/cm^3$ to $6 \times 10^{16}/cm^3$.

In any of the above structures, silane or disilane can be used as the silane based gas. Further, a rare gas can be added to the source gas.

The plasma CVD method can be performed using a plasma CVD apparatus. In this case, the plasma CVD apparatus preferably has a pressure of 1 Pa or more and $10^3$ Pa or less in a chamber.

Since the thickness of the single crystal semiconductor layer of the photoelectric conversion layer is increased in accordance with a crystal epitaxial growth technique, it is possible to improve photoelectric conversion efficiency while suppressing the consumption of resources. Moreover, the consumption of single crystal semiconductor, which is the material, can be reduced by slicing a superficial portion of a single crystal semiconductor substrate and bonding the portion to the supporting substrate as a single crystal semiconductor layer. Furthermore, the single crystal semiconductor substrate from which the single crystal semiconductor layer has been separated can be reused. Thus, the resources can be effectively utilized and a photoelectric conversion device having an excellent photoelectric conversion characteristic can be obtained.

DETAILED DESCRIPTION OF THE INVENTION

Figure 1:
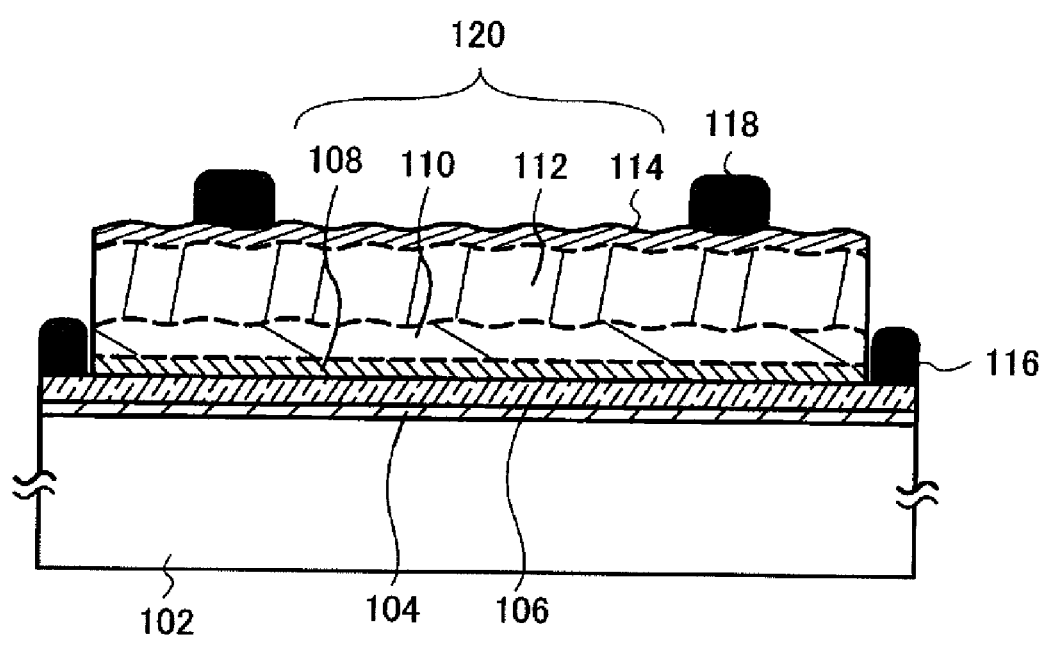
FIG. 1 is a cross-sectional view showing an example of a photoelectric conversion device according to an aspect of the present invention.

Embodiment modes of the present invention are hereinafter described in detail with reference to the drawings. However, it is to be easily understood that various changes and modifications will be apparent to those skilled in the art. Therefore, unless such changes and modifications depart from the scope of the invention, they should be construed as being included therein. Note that in the structure of the present invention which is hereinafter described, the reference numerals denoting the same portions are used in common in different drawings.

Embodiment Mode 1

Figure 2:
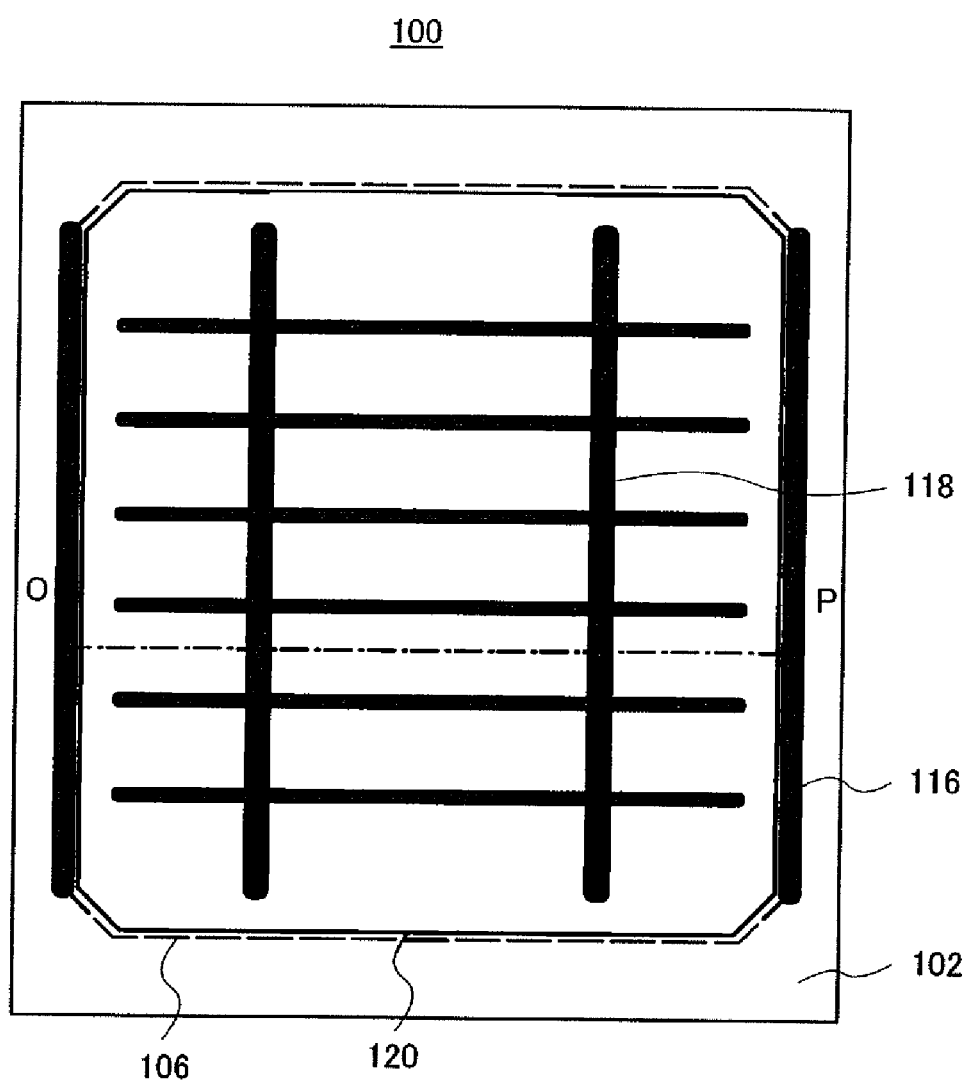
FIG. 2 is a top view showing an example of a photoelectric conversion device according to an aspect of the present invention.

FIG. 1 is a schematic cross sectional view of a photoelectric conversion device 100 according to this embodiment mode. FIG. 2 is a schematic top view of the photoelectric conversion device 100 according to this embodiment mode. Note that FIG. 1 shows an example of a cross section along a line O-P in FIG. 2.

The photoelectric conversion device 100 shown in this embodiment mode includes a unit cell 120 fixed to a supporting substrate 102. The unit cell 120 includes a single crystal semiconductor layer. The unit cell 120 is provided with a first electrode 106 on the supporting substrate 102 side and with a second electrode 118 on the surface side of the unit cell 120. Moreover, an auxiliary electrode 116 is provided in electrical connection with the first electrode 106. The photoelectric conversion device 100 of this embodiment mode has a structure in which the unit cell 120 is fixed to the supporting substrate 102, and a positive electrode and a negative electrode, or electrodes each connected to a positive or negative electrode are exposed to the same surface side of the supporting substrate 102.

The supporting substrate 102 to which the unit cell 120 is fixed is a substrate having an insulating surface or an insulating substrate, and any of a variety of glass substrates that are used in the electronics industry, such as aluminosilicate glass substrates, aluminoborosilicate glass substrates, and barium borosilicate glass substrates, can be used.

An insulating layer 104 is provided between the supporting substrate 102 and the unit cell 120. The first electrode 106 is provided between the unit cell 120 and the insulating layer 104, and the second electrode 118 is provided on a surface of the unit cell 120 on the side opposite to the supporting substrate 102 side. The unit cell 120 is sandwiched between the first electrode 106 and the second electrode 118. Moreover, the insulating layer 104 is bonded to the supporting substrate 102 and is further in close contact with the first electrode 106, whereby the unit cell 120 is fixed to the supporting substrate 102. That is to say, the insulating layer 104 functions as a bonding layer that bonds the unit cell 120 and the supporting substrate 102 to each other. For example, a layer with an average surface roughness Ra of 0.5 nm or less, preferably 0.3 nm or less is formed as the insulating layer 104. Note that the average surface roughness (Ra) in this specification refers to centerline average roughness obtained by three-dimensional expansion of centerline average roughness which is defined by JIS B0601 so as to apply to a plane.

The first electrode 106 is provided between the unit cell 120 and the supporting substrate 102. The unit cell 120 is provided over the approximately entire surface of the first electrode 106 and the supporting substrate 102 is provided under the first electrode 106. Therefore, in this state, electric energy is difficult to extract from the photoelectric conversion device to the outside. Accordingly, the auxiliary electrode 116 for electric connection is formed as an extracting electrode, so that electric energy can be easily extracted to the outside.

The unit cell 120 has a stacked structure in which a first impurity semiconductor layer 108 having one conductivity type, a first single crystal semiconductor layer 110, a second single crystal semiconductor layer 112, and a second impurity semiconductor layer 114 having a conductivity type opposite to that of the first impurity semiconductor layer 108 are stacked in order. Note that the first impurity semiconductor layer 108 may be eliminated if the second impurity semiconductor layer 114 and the first single crystal semiconductor layer 110 have the opposite conductivity type to each other.

Single crystal silicon is used typically for the first single crystal semiconductor layer 110 and the second single crystal semiconductor layer 112 of the unit cell 120. Moreover, a polycrystalline semiconductor layer (typically, polycrystalline silicon) may be used instead of the single crystal semiconductor layer. Each of the first impurity semiconductor layer 108 having one conductivity type and the second impurity semiconductor layer 114 having a conductivity type opposite to that of the first impurity semiconductor layer 108 corresponds to a semiconductor layer to which an impurity element imparting a predetermined conductivity type has been added. If the first impurity semiconductor layer 108 has p type conductivity, the second impurity semiconductor layer 114 has n type conductivity. Needless to say, the first impurity semiconductor layer 108 may have n type conductivity and the second impurity semiconductor layer 114 may have p type conductivity. An element belonging to Group 13 in the periodic table, such as boron or aluminum, is used as a p type impurity element, and an element belonging to Group 15 in the periodic table, such as phosphorus or arsenic, is used as an n type impurity element. The impurity element can be added by ion implantation or ion doping.

In this specification, "ion implantation" refers to a method by which ions generated from a source gas are mass separated and introduced to an object, while "ion doping" refers to a method by which ions generated from a source gas are introduced to an object without mass separation.

The first single crystal semiconductor layer 110 is formed by slicing a single crystal semiconductor substrate. For example, ions or cluster ions generated from a source gas including hydrogen are introduced at high concentration at a predetermined depth of a single crystal semiconductor substrate and then heat treatment is performed thereon. Thus, a single crystal semiconductor layer at a superficial layer can be separated. Alternatively, a single crystal semiconductor layer may be epitaxially grown on a porous semiconductor layer (typically, a porous silicon layer) and then the porous semiconductor layer may be cleaved to be separated by waterjetting. As the single crystal semiconductor substrate, a single crystal silicon wafer is typically employed.

The second single crystal semiconductor layer 112 is formed by epitaxially growing the first single crystal semiconductor layer 110. Specifically, the second single crystal semiconductor layer 112 is formed by performing vapor phase epitaxy on the first single crystal semiconductor layer 110 in accordance with a plasma CVD method using a mixed gas of a silane based gas and hydrogen as a source gas. That is to say, the second single crystal semiconductor layer 112 is an epitaxially grown layer of the first single crystal semiconductor layer 110. Since the first single crystal semiconductor layer 110 is single crystal semiconductor obtained by slicing a single crystal semiconductor substrate, the second single crystal semiconductor layer 112 obtained by epitaxially growing the first single crystal semiconductor layer 110 is single crystal semiconductor.

The single crystal semiconductor layer which forms the photoelectric conversion layer of the unit cell 120 includes the first single crystal semiconductor layer 110 and the second single crystal semiconductor layer 112 and has a total film thickness of 800 nm or more, preferably 1000 nm or more. The first single crystal semiconductor layer 110 has a thickness of less than 1000 nm, preferably less than 800 nm, more preferably 5 nm or more and 300 nm or less. The second single crystal semiconductor layer 112 is epitaxially grown on the first single crystal semiconductor layer 110. The epitaxial growth is performed by a plasma CVD method using a mixed gas of a silane based gas and hydrogen as a source gas. The source gas is formed by diluting the silane based gas with hydrogen so that the flow rate of hydrogen is 50 times or more, preferably 100 times or more that of the silane based gas. Note that the source gas may include a rare gas. In consideration of the takt time of the epitaxial growth or the like, the second single crystal semiconductor layer 112 preferably has a thickness of 100 nm or more and 2000 nm or less. If single crystal silicon is used for the first single crystal semiconductor layer 110 and the second single crystal semiconductor layer 112, a thickness of at least about 800 nm is necessary to absorb sunlight because single crystal silicon has an energy gap of 1.12 eV and is indirect transition type semiconductor.

Note that single crystals are crystals whose crystal faces and crystal axes are aligned and whose atoms or molecules are spatially ordered. However, although single crystals are structured by orderly aligned atoms, single crystals may include a lattice defect in which the alignment is partially disordered or single crystals may include intended or unintended lattice distortion.

Since the second single crystal semiconductor layer 112 is obtained by epitaxially growing the first single crystal semiconductor layer 110, the both have their crystal faces and crystal axes (crystal orientation) substantially align.

However, the first single crystal semiconductor layer 110 and the second single crystal semiconductor layer 112 have different conductivity type in some cases. If the first single crystal semiconductor layer 110 is formed by slicing a p type single crystal semiconductor substrate, the first single crystal semiconductor layer 110 has p type conductivity. If the first single crystal semiconductor layer 110 is formed by slicing an n type single crystal semiconductor substrate, the first single crystal semiconductor layer 110 has n type conductivity. The second single crystal semiconductor layer 112 is intrinsic (i type) semiconductor if the source gas used for the epitaxial growth does not include an impurity imparting one conductivity type (if the source gas does not include a doping gas imparting n type or p type conductivity).

The crystallinity of the second single crystal semiconductor layer 112 can be known based on peak positions of Raman shift obtained from measurement data of Raman spectrum, inverse pole figure (IPF) map of electron beams obtained from measurement data of electron back scattering diffraction pattern (EBSP), lattice images or electron beam diffraction images obtained from a transmission electron microscope (TEM), and the like.

The second electrode 118 has a grid shape (or a comb-like shape or a pectinate shape) so that the effective area where the unit cell 120 receives light is as large as possible. In the photoelectric conversion device according to this embodiment mode, the area of the second electrode 118 that covers the surface of the unit cell 120 is made as small as possible so that the surface of the unit cell 120 is exposed as large as possible, because light is absorbed from the second electrode 118 side.

Further, the auxiliary electrode 116 is provided in electrical connection with the first electrode 106. The auxiliary electrode 116 and the second electrode 118 are exposed to the same surface side.

Next, an example of a method of manufacturing the photoelectric conversion device 100 of this embodiment mode is described with reference to FIGS. 3A to 3D, FIGS. 4A and 4B, FIGS. 5A and 5B, and FIGS. 6A and 6B.

A single crystal semiconductor substrate 103 is prepared. A fragile layer 105 is formed in a region at a predetermined depth of the single crystal semiconductor substrate 103, and a first impurity semiconductor layer 108 is formed on one surface side of the single crystal semiconductor substrate 103. Moreover, the first electrode 106 and the insulating layer 104 are stacked in order over the one surface of the single crystal semiconductor substrate 103. Note that the first electrode 106 is formed on the side where the first impurity semiconductor layer 108 was formed or on the one surface side where the first impurity semiconductor layer 108 will be formed (see FIG. 3D).

The order of forming the fragile layer 105, the first impurity semiconductor layer 108, the first electrode 106, and the insulating layer 104 is not limited; they may be formed in accordance with any of the following (1) to (4). (1) A protection layer is formed on one surface of a single crystal semiconductor substrate, a first impurity semiconductor layer is formed on the one surface side of the single crystal semiconductor substrate by adding an impurity element imparting one conductivity type through the surface where the protection layer is formed, and a fragile layer is formed in a region at a predetermined depth of the single crystal semiconductor substrate by irradiating the single crystal semiconductor substrate with ions or cluster ions through the surface where the protection layer is formed. After removing the protection layer, a first electrode is formed over the first impurity semiconductor layer on the surface side where the protection layer was formed and then an insulating layer was formed and then an insulating layer is formed over the first electrode. (2) A protection layer is formed on one surface of a single crystal semiconductor substrate, a fragile layer is formed in a region at a predetermined depth of the single crystal semiconductor substrate by irradiating the single crystal semiconductor substrate with ions or cluster ions through the surface where the protection layer is formed, and a first impurity semiconductor layer is formed on the one surface side of the single crystal semiconductor substrate by adding an impurity element imparting one conductivity type through the surface where the protection layer is formed. After removing the protection layer, a first electrode is formed over the first impurity semiconductor layer on the surface side where the protection layer was formed and then an insulating layer is formed over the first electrode. (3) A first electrode is formed on one surface of a single crystal semiconductor substrate. An impurity element imparting one conductivity type is added through the surface where the first electrode is formed, whereby a first impurity semiconductor layer is formed on the one surface side of the single crystal semiconductor substrate where the first electrode is formed. Further, a fragile layer is formed in a region at a predetermined depth of the single crystal semiconductor substrate by irradiating the single crystal semiconductor substrate with ions or cluster ions through the surface where the first electrode is formed, and then an insulating layer is formed over the first electrode. (4) A first electrode is formed on one surface of a single crystal semiconductor substrate. A fragile layer is formed in a region at a predetermined depth of the single crystal semiconductor substrate by irradiating the single crystal semiconductor substrate with ions or cluster ions through the surface where the first electrode is formed. An impurity element imparting one conductivity type is added through the surface where the first electrode is formed, whereby a first impurity semiconductor layer is formed on the one surface side of the single crystal semiconductor substrate where the first electrode is formed. An insulating layer is formed over the first electrode.

In this embodiment mode, the example in which formation order follows (1) is described with reference to FIGS. 3A to 3D.

A protection layer 107 is formed on one surface of the single crystal semiconductor substrate 103. Then, the first impurity semiconductor layer 108 is formed by adding an impurity element imparting one conductivity type through the surface where the protection layer 107 is formed (see FIG. 3A).

As the single crystal semiconductor substrate 103, a semiconductor wafer of silicon, germanium, or the like; a compound semiconductor wafer of gallium arsenide, indium phosphide, or the like; or the like is used. A single crystal silicon wafer is preferably used. The shape of a top face of the single crystal semiconductor substrate 103 is not particularly limited but is preferably substantially rectangular if a supporting substrate to which the single crystal semiconductor substrate 103 is later fixed is rectangular in shape. Moreover, the surface of the single crystal semiconductor substrate 103 is preferably polished to have a mirror surface considering that the substrate is later fixed to the supporting substrate. For example, a p type single crystal silicon wafer with a resistivity of about 1 Ωcm to 10 Ωcm is used as the single crystal semiconductor substrate 103.

Figure 9A:
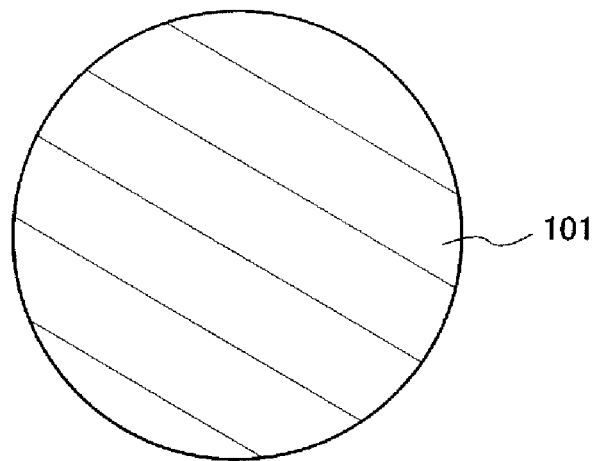
FIGS. 9A to 9C each show a mode of a semiconductor substrate with a predetermined shape cut out from a circular single crystal semiconductor substrate.
Figure 9B:
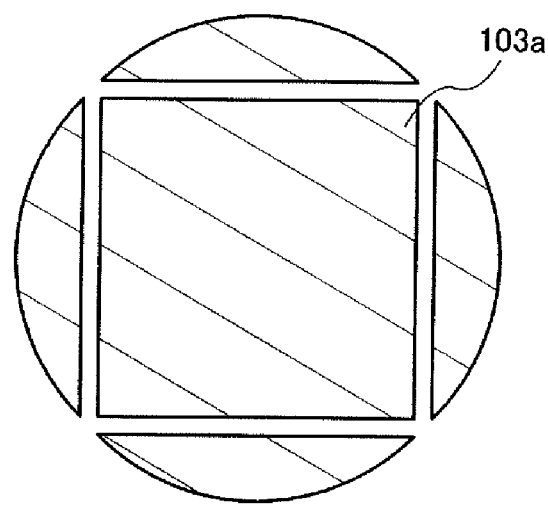
Figure 9C:
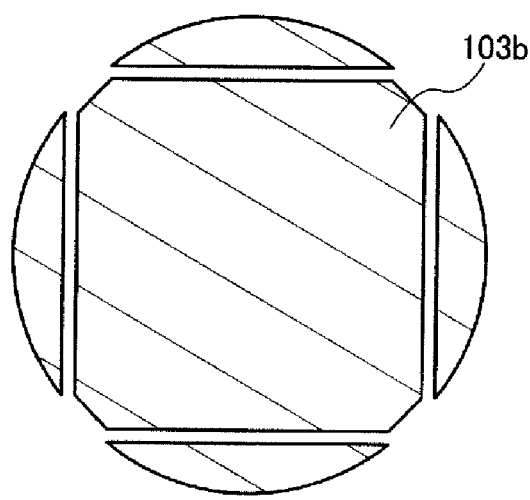

Many of single crystal silicon wafers circulating in the market are circular in shape. In those cases, a circular single crystal silicon wafer may be cut into to have an approximately rectangular shape. For example, a circular single crystal semiconductor substrate 101 as shown in FIG. 9A can be cut out into a single crystal semiconductor substrate 103a with an approximately rectangular shape as shown in FIG. 9B or a single crystal semiconductor substrate 103b with an approximately rectangular shape as shown in FIG. 9C. Note that FIG. 9B shows the case where the single crystal semiconductor substrate 103a is cut out to have a rectangular shape of maximum size with its corners being in contact with the periphery of the circular single crystal semiconductor substrate 101. The angle at each corner of the single crystal semiconductor substrate 103a is about 90 degrees. FIG. 9C shows the case where the single crystal semiconductor substrate 103b is cut out so that the distance between the opposing lines is longer than that of the rectangular region with the maximum size whose corners are in contact with the periphery of the circular single crystal semiconductor substrate 101. The angle at each corner of the single crystal semiconductor substrate 103b is not 90 degrees but the single crystal semiconductor substrate 103b has a polygonal shape, not a rectangular shape.

Figure 3A:
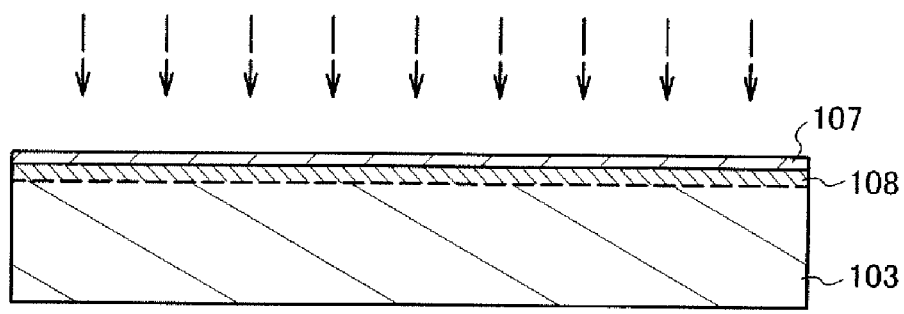
FIGS. 3A to 3D are cross-sectional views showing an example of a method of manufacturing a photoelectric conversion device according to an aspect of the present invention.

As shown in FIG. 3A, the protection layer 107 is formed on one surface of the single crystal semiconductor substrate 103. The protection layer 107 is preferably formed of silicon oxide or silicon nitride specifically by a plasma CVD method. Alternatively, the protection layer 107 can be formed by oxidizing the single crystal semiconductor substrate 103 with use of oxidizing chemicals or oxygen radicals. Further alternatively, the protection layer 107 can be formed by oxidizing the surface of the single crystal semiconductor substrate 103 by a thermal oxidizing method. By the formation of the protection layer 107, it is possible to prevent the substrate surface from being damaged at the time of forming the fragile layer in the single crystal semiconductor substrate 103 or adding an impurity element imparting one conductivity type to the single crystal semiconductor substrate.

An impurity element imparting one conductivity type is added to the single crystal semiconductor substrate 103, whereby the first impurity semiconductor layer 108 is formed on the one surface side of the single crystal semiconductor substrate 103. The first impurity semiconductor layer 108 is formed to a thickness of 30 nm to 150 nm, preferably 50 nm to 100 nm. The impurity element imparting one conductivity type is added through the protection layer 107 formed over the single crystal semiconductor substrate 103. For example, boron is added as the impurity element imparting one conductivity type, thereby forming the first impurity semiconductor layer 108 having p type conductivity. Boron is added preferably using an ion doping apparatus in such a manner that ions generated from a source gas including $B_2H_6$ or $BF_3$ are accelerated by voltage without mass separation and the substrate is irradiated with the ions. This is because the area to be irradiated with the ion beam can be enlarged even when the area of the single crystal semiconductor substrate 103 exceeds 300 mm diagonally, and the process can be efficient. For example, a linear ion beam whose long side has a length of more than 300 mm is formed and delivered from one end to the other end of the single crystal semiconductor substrate 103; thus, the first impurity semiconductor layer 108 can be formed homogeneously over the entire surface of the single crystal semiconductor substrate 103.

The first impurity semiconductor layer 108 can be formed by a thermal diffusion method. However, a thermal diffusion method is carried out before the formation of the fragile layer because a high temperature of about 900° C. or more is applied.

In the photoelectric conversion device of this embodiment mode, the first impurity semiconductor layer 108 is disposed on the side opposite to the light incidence side, so that a back surface field (BSF) is formed. If the single crystal semiconductor substrate 103 is a p type substrate, the impurity semiconductor layer including a p type impurity element (the first impurity semiconductor layer 108 in this embodiment mode) is not necessary. However, by arrangement of a high-concentration p type region (the first impurity semiconductor layer 108) and a low-concentration p type region (the first single crystal semiconductor layer sliced from the single crystal semiconductor substrate) in this manner, light confinement effect can prevent recombination of carriers (electrons and holes) generated by optical excitation and increase carrier collecting efficiency. Accordingly, the photoelectric conversion efficiency of the photoelectric conversion device can be improved.

Figure 3B:
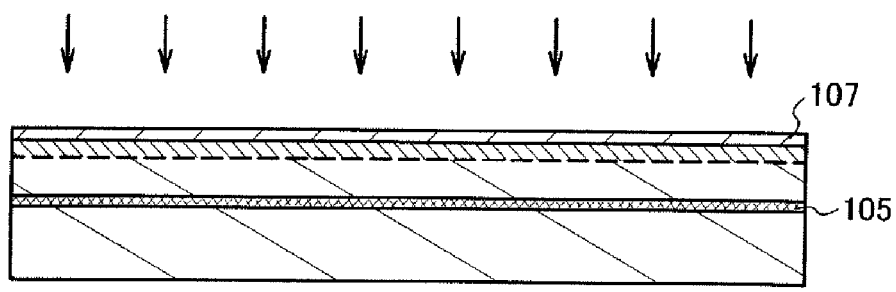

The single crystal semiconductor substrate 103 is irradiated with ions or cluster ions generated from a source gas including hydrogen, thereby forming the fragile layer 105 in a region at a predetermined depth of the single crystal semiconductor substrate 103 (see FIG. 3B). By the irradiation with the ions or cluster ions, hydrogen is introduced to the single crystal semiconductor substrate 103, whereby Si—Si bonds are disconnected and terminated with hydrogen in a region of the single crystal semiconductor substrate 103 where hydrogen is introduced. Therefore, the fragile layer 105 is formed at a certain depth of the single crystal semiconductor substrate 103 and the depth is in proportion to the acceleration voltage.

The surface of the single crystal semiconductor substrate 103 that is provided with the protection layer 107 is irradiated with the ions or cluster ions, so that the fragile layer 105 is formed in a region at a certain depth from the surface of the single crystal semiconductor substrate 103. As the ions or cluster ions generated from the source gas including hydrogen, $H^+$ ions, $H_2^+$ ions, or $H_3^+$ ions are given. $H_3^+$ ions are preferably used because the introduction efficiency of hydrogen can be improved to shorten the takt time of forming the fragile layer 105. The depth of the fragile layer 105 in the single crystal semiconductor substrate 103 is controlled by the acceleration voltage at the time of ion introduction. Moreover, the thickness of the single crystal semiconductor layer to be separated from the single crystal semiconductor substrate 103 depends on the depth at which the fragile layer 105 is formed. Accordingly, the acceleration voltage of the ions is determined in consideration of the thickness of the single crystal semiconductor layer to be separated.

The depth at which the fragile layer 105 is formed is less than 1000 nm, preferably less than 800 nm, and more preferably 60 nm or more and 300 nm or less from the surface of the single crystal semiconductor substrate 103. The shallower the fragile layer 105 is formed, the thicker the single crystal semiconductor substrate remains after the separation of the single crystal semiconductor layer; accordingly, the number of times of reusing the substrate can be increased. However, the acceleration voltage needs to be lower in order to form the fragile layer 105 shallower. When the acceleration voltage is low, the introduction takes longer time and the takt time goes worse; therefore, the fragile layer 105 is formed at depth in consideration of the productivity or the like.

The doping with the cluster ions such as $H_3^+$ ions can be performed using an ion doping apparatus in such a manner that hydrogen plasma is generated from a source gas including hydrogen, the cluster ions generated in the hydrogen plasma are accelerated by voltage without mass separation, and irradiation is performed. By the use of the ion doping apparatus, the single crystal semiconductor substrate 103 even with a large area can be homogeneously doped.

Here, an example of forming the fragile layer 105 is described. For example, a single crystal silicon substrate is used as the single crystal semiconductor substrate 103 and the protection layer 107 is formed to a thickness of 100 nm. Ion doping is performed under the condition where $H_2$ is used for a source gas, the acceleration voltage is 25 kV, the RF electric power is 100 W, and the dosage is $2.2 \times 10^{16}$ ions/cm². With the fragile layer 105 formed under such a condition, a single crystal silicon layer of about 120 nm thick can be separated from the single crystal silicon substrate by later heat treatment.

Figure 22:
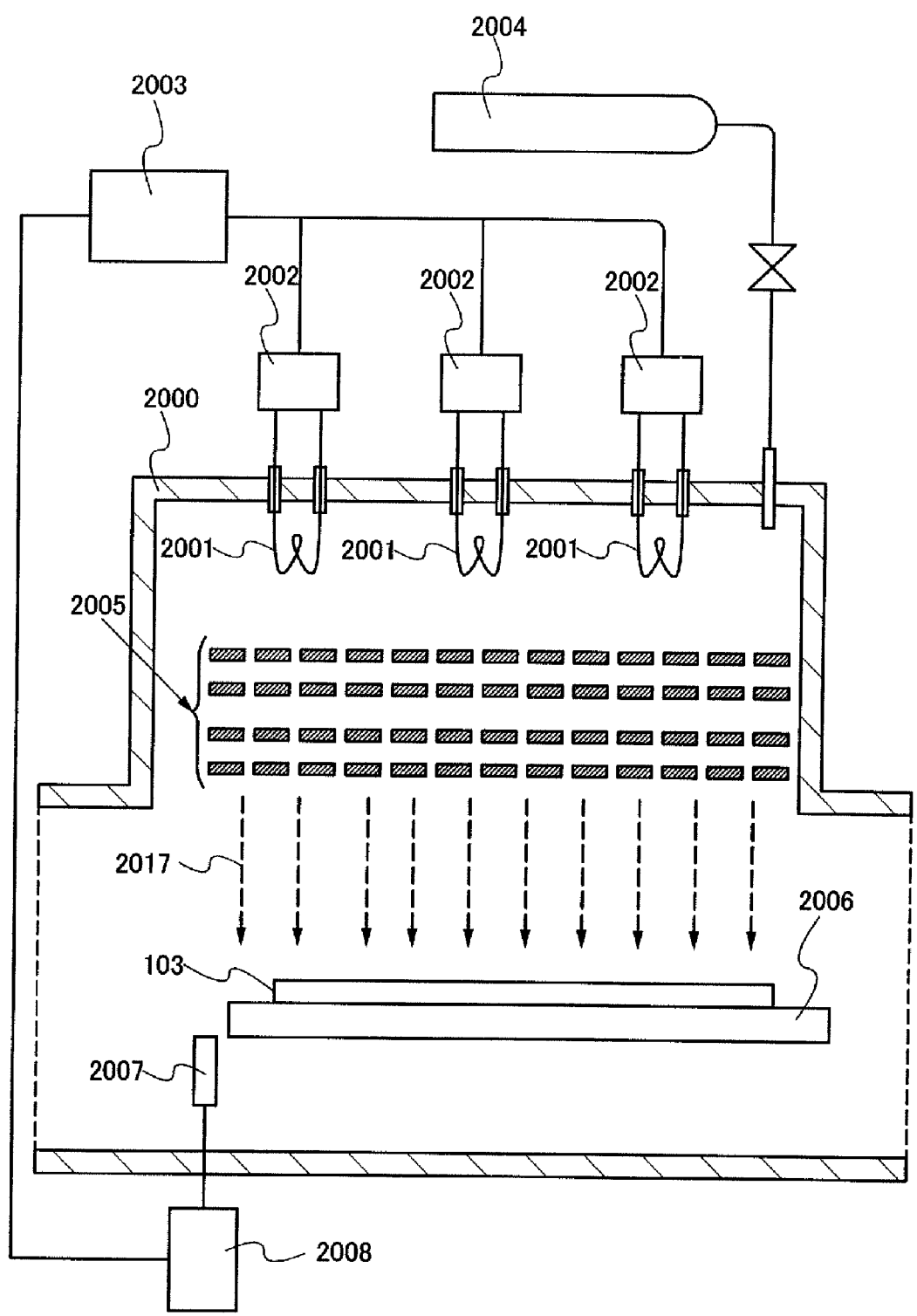
FIG. 22 is a schematic diagram showing a structure of an ion doping apparatus which can be applied to the present invention.

FIG. 22 shows an example of a schematic diagram, which illustrates a structure of an ion doping apparatus which irradiates the single crystal semiconductor substrate 103 with a plurality of kinds of ions generated from an ion source 2000 without mass separation. A predetermined source gas including hydrogen or the like is supplied from a gas supplying portion 2004 to the ion source 2000. The ion source 2000 is provided with filaments 2001. A filament power source 2002 applies arc discharge voltage to each filament 2001 to control the amount of current that flows to the filament 2001. The source gas supplied from the gas supplying portion 2004 is exhausted through an exhaustion system.

The ions generated from the ion source 2000 are extracted through an extraction electrode system 2005 and an ion beam 2017 is thus formed. The single crystal semiconductor substrate 103 disposed on a mounting board 2006 is irradiated with the ion beam 2017. The proportions of the kinds of ions in the ion beam 2017 are calculated with a mass spectrometer tube 2007 provided in the vicinity of the mounting board 2006. The ion density calculated with the mass spectrometer tube 2007 is converted into signals by using a mass spectrometer 2008 and the results may be fed back to a power source controller 2003. The power source controller 2003 can control the filament power sources 2002 in accordance with calculation results on the ion density.

As shown in FIG. 22, the source gas including hydrogen or the like supplied from the gas supplying portion 2004 flows through the chamber of the ion doping apparatus and is exhausted through the exhaustion system.

The irradiation of the substrate with the ion beam including a large amount of $H_3^+$ ions, which are cluster ions, gives advantageous effects in that the introduction efficiency of hydrogen is improved and hydrogen can be introduced to the single crystal semiconductor substrate 103 at high concentration even if the dosage is low, as compared with the irradiation with $H^+$ ions or $H_2^+$ ions.

When the proportion of $H_3^+$ ions is large, the fragile layer 105 can include hydrogen at a concentration of $1 \times 10^{20}$ atoms/cm³ or more, preferably $5 \times 10^{20}$ atoms/cm³ or more. Since the region including hydrogen at high concentration is formed locally in the single crystal semiconductor substrate 103, a crystal structure is damaged and very small voids are formed. Therefore, the fragile layer 105 formed in the single crystal semiconductor substrate 103 has a porous structure. When heat treatment is performed at comparatively low temperature (600° C. or lower), the very small voids formed in the fragile layer 105 change in volume, whereby the single crystal semiconductor substrate 103 can be separated along the fragile layer 105. The concentration of hydrogen in the fragile layer 105 depends on the dosage, acceleration voltage, or the like of the ions or cluster ions.

Note that the depth at which the fragile layer 105 is formed can be homogenized when the ions or cluster ions are introduced in such a manner that a linear ion beam longer than one side of the single crystal semiconductor substrate 103 with an approximately rectangular shape scans the surface of the single crystal semiconductor substrate 103.

Moreover, when the fragile layer 105 is formed in such a manner that the substrate is irradiated through the first impurity semiconductor layer 108 with the ions or cluster ions generated from a source gas including hydrogen, hydrogenation of the first impurity semiconductor layer 108 can also be performed.

Figure 3C:
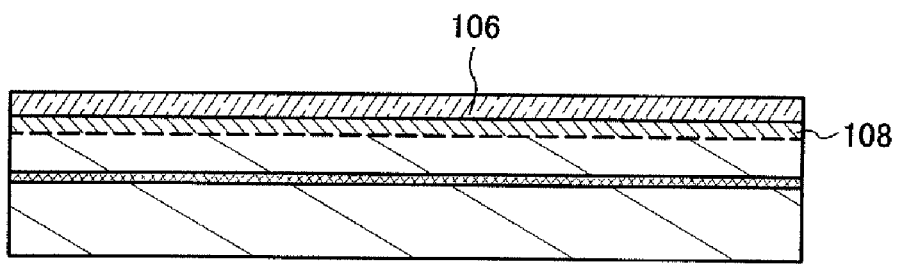

After the protection layer 107 formed over the single crystal semiconductor substrate 103 is removed, the first electrode 106 is formed over the first impurity semiconductor layer 108 (see FIG. 3C).

The first electrode 106 needs to be formed of a material which resists the temperature of heat treatment later performed for separating the single crystal semiconductor substrate 103; therefore, a metal with a high melting point is preferred. In specific, the heat resistance to the temperature about the strain point of the supporting substrate 102 is necessary. For example, a metal material such as titanium, molybdenum, tungsten, tantalum, chromium, or nickel is applied. A stacked structure of the aforementioned metal material and a nitride of the metal material can be applied. For example, a stacked structure of a titanium nitride layer and a titanium layer, a stacked structure of a tantalum nitride layer and a tantalum layer, a stacked structure of a tungsten nitride layer and a tungsten layer, or the like is given. In the case of the stacked structure including a nitride, the nitride is formed in contact with the first impurity semiconductor layer 108. By the formation of the nitride, the first electrode 106 and the first impurity semiconductor layer 108 can have closer contact to each other. The first electrode 106 is formed to a thickness of 100 nm or more by an evaporation method or a sputtering method.

Figure 3D:
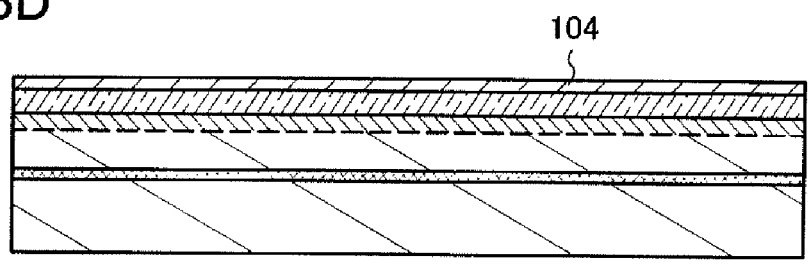

The insulating layer 104 is formed over the first electrode 106 (see FIG. 3D). The insulating layer 104 may have a single-layer structure or a stacked structure of two or more layers; in any case, the outermost surface (bonding plane) of the insulating layer 104 is preferably smooth. In addition to being smooth, the outermost surface is more preferably hydrophilic. For example, a silicon oxide layer, a silicon nitride layer, a silicon oxynitride layer, or a silicon nitride oxide layer is formed. As a method of forming the insulating layer 104, a CVD method such as a plasma CVD method, a photo CVD method, or a thermal CVD method is preferred. Note that the category of a thermal CVD method includes a low pressure CVD method and a normal pressure CVD method. In particular, a layer with excellent smoothness can be formed by a plasma CVD method. As for the smoothness of the insulating layer 104, specifically, the average surface roughness Ra is 0.5 nm or less, preferably 0.3 nm or less.

Note that a silicon oxynitride layer in this specification means a layer that contains more oxygen than nitrogen, and in the case where measurements are performed using Rutherford backscattering spectrometry (RBS) and hydrogen forward scattering (HFS), contains oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

For the layer having a smooth and hydrophilic surface, for example, silicon oxide formed by a plasma CVD method using organosilane for a source gas is preferably used. For instance, the bonding between the supporting substrate and the unit cell to be formed later can be strengthened if a silicon oxide layer formed by a plasma CVD method using organosilane for a source gas is used. Examples of organosilane include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and tris(dimethylamino) silane (chemical formula: $SiH(N(CH_3)_2)_3$).

For the layer having a smooth and hydrophilic surface, silicon oxide, silicon oxynitride, silicon nitride, or silicon nitride oxide which is formed by a plasma CVD method using an inorganic silane such as monosilane, disilane, or trisilane for a source gas can also be used. For example, a silicon nitride layer formed by a plasma CVD method using a silane gas and an ammonia gas for a source gas can be applied. The source gas may further include hydrogen. Alternatively, a silicon nitride oxide layer can be formed by a plasma CVD method using a dinitrogen monoxide gas, in addition to the silane gas and the ammonia gas, for a source gas.

For example, the insulating layer 104 is formed using a stack of a 50-nm-thick silicon oxynitride layer, a 50-nm-thick silicon nitride oxide layer, and a 50-nm-thick silicon oxide layer. These insulating layers can be formed by a plasma CVD method. The silicon oxide layer, which is the uppermost layer and serves as the bonding plane, has an Ra of 0.5 nm or less, preferably 0.3 nm or less after the formation, and the silicon oxide layer is formed by, for example, a plasma CVD method using TEOS for a source gas. When the insulating layer 104 includes a silicon insulating layer including nitrogen, specifically a silicon nitride oxide layer, diffusion of impurities from the supporting substrate 102 which is later bonded can be prevented.

In any case, silicon oxide, silicon nitride, silicon oxynitride, or silicon nitride oxide formed by a CVD method typified by a plasma CVD method can be applied as long as the layer whose outermost surface is smooth can be formed. In the case of the stacked structure, there is no limitation on another layer except the layer which forms the outermost surface. The insulating layer 104 needs to be formed at a temperature at which hydrogen is not desorbed from the fragile layer 105 formed in the single crystal semiconductor substrate 103, preferably at 350° C. or lower.

Figure 4A:
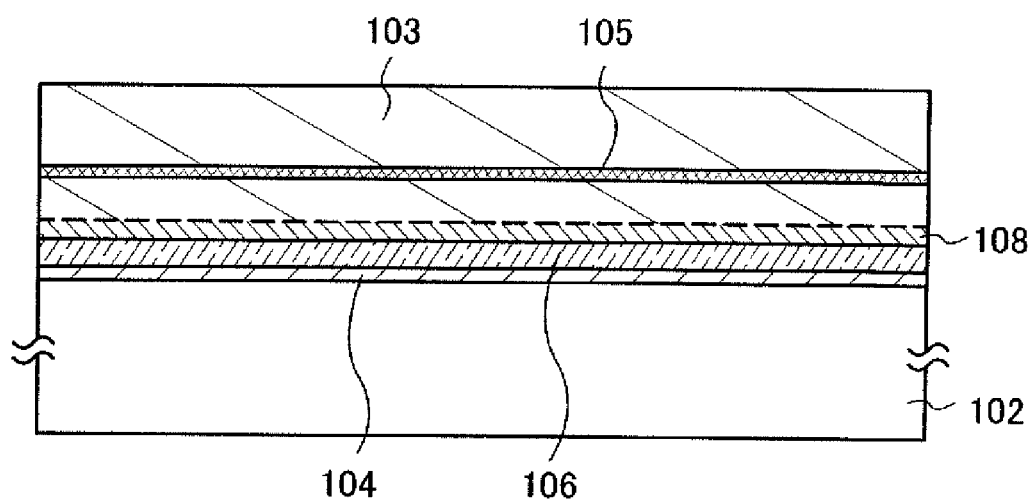
FIGS. 4A and 4B are cross-sectional views showing an example of a method of manufacturing a photoelectric conversion device according to an aspect of the present invention.

The surface of the single crystal semiconductor substrate 103 that is provided with the first electrode 106 is bonded to one surface of the supporting substrate 102 (see FIG. 4A). In this embodiment mode, the insulating layer 104 is interposed between the first electrode 106 and the supporting substrate 102. The bonding plane corresponds to one surface of the insulating layer 104 (the surface not in contact with the first electrode 106) and the one surface of the supporting substrate 102.

The bonding plane (here, the one surface of the insulating layer 104 and the one surface of the supporting substrate 102) should be cleaned sufficiently in advance. The bonding plane is preferably cleaned by washing or the like because a bonding defect would be caused if the bonding plane had particles such as microscopic dust. Then, the insulating layer 104 formed over the first electrode 106 and the supporting substrate 102 are disposed in close contact, thereby forming the bonding. In this embodiment mode, the insulating layer 104 has a hydrophilic surface and the bonding is formed by an operation of van der Waals force or hydrogen bonding. When one or both of the bonding planes have hydrophilic surfaces, a hydroxyl group or a water molecule functions as an adhesive and water molecules diffuse in later heat treatment. The remaining composition forms a silanol group (Si—OH) and the bonding is formed by hydrogen bonding. Further, this bonding portion forms a siloxane bonding (O—Si—O) by release of hydrogen to become a covalent bond, which forms firmer bonding. The bonding plane of the supporting substrate 102 may be provided with a silicon insulating layer including nitrogen, such as a silicon nitride layer or a silicon nitride oxide layer. The silicon insulating layer including nitrogen can function as a blocking layer which prevents contamination of impurities from the supporting substrate 102.

In order to favorably perform bonding between the supporting substrate 102 and the insulating layer 104, the bonding plane may be activated in advance. For example, one or both of the bonding planes are irradiated with an atomic beam or an ion beam. As the atomic beam or the ion beam, an inert gas neutral atom beam or inert gas ion beam of argon or the like can be used. It is also possible to activate the bonding plane by plasma irradiation or radical treatment. Such surface treatment facilitates forming of bonding between different kinds of materials even at a temperature of 400° C. or lower. Alternatively, one or both of the bonding planes may be cleaned with ozone-containing water, oxygen-containing water, hydrogen-containing water, pure water, or the like. Such cleaning treatment can make the bonding plane hydrophilic and increase the number of hydroxyl groups at the bonding plane, thereby further strengthening the bonding.

After bonding the single crystal semiconductor substrate 103 and the supporting substrate 102 to each other, heat treatment or pressure treatment is preferably performed. Heat treatment or pressure treatment can increase the bonding strength. If the heat treatment is performed, the temperature of the heat treatment is set at a temperature that is lower than or equal to the strain point of the supporting substrate 102 and is a temperature at which the volume change does not occur in the fragile layer 105 formed in the single crystal semiconductor substrate 103, preferably at a temperature higher than or equal to room temperature and lower than 400° C. Note that this heat treatment and another heat treatment for later separating part of the single crystal semiconductor substrate using the fragile layer 105 as a separation plane may be successively performed. The pressure treatment is preformed so that pressure is applied in a direction perpendicular to the bonding plane in consideration of pressure resistance of the supporting substrate 102 and the single crystal semiconductor substrate 103.

If the surface of the first electrode 106 (the surface opposite to the surface on the first impurity semiconductor layer 108 side) is smooth, specifically the average surface roughness Ra thereof is 0.5 nm or less, preferably 0.3 nm or less, bonding with the supporting substrate might be possible even without the insulating layer 104. In that case, the first electrode 106 and the supporting substrate may be directly bonded to each other without the insulating layer 104.

Heat treatment is performed to separate part of the single crystal semiconductor substrate 103 from the supporting substrate 102 with the fragile layer 105 or the vicinity of the fragile layer 105 used as a separation plane. The first single crystal semiconductor layer 110 separated from the single crystal semiconductor substrate 103 remains over the supporting substrate 102, and thus a so-called SOI structure is obtained. The first single crystal semiconductor layer 110 has the same or substantially the same crystallinity as the single crystal semiconductor substrate 103. Moreover, a separation substrate 109 from which the first single crystal semiconductor layer 110 has been separated is obtained (see FIG. 4B).

The temperature of the heat treatment performed for separating part of the single crystal semiconductor substrate 103 at the vicinity of the fragile layer 105 is preferably more than or equal to the temperature of forming the insulating layer 104 and less than or equal to the strain point of the supporting substrate 102. When the heat treatment is performed at, for example, 400° C. or more and less than 700° C., the very small voids formed in the fragile layer 105 change in volume, whereby separation occurs along the fragile layer 105. Since the insulating layer 104 is bonded to the supporting substrate 102, the first single crystal semiconductor layer 110 provided with the first electrode 106 and the first impurity semiconductor layer 108 remains over the supporting substrate 102. The thickness of the remaining first single crystal semiconductor layer 110 almost corresponds to the depth at which the fragile layer 105 is formed, which is less than 1000 nm, preferably less than 800 nm, and more preferably 60 nm or more and 300 nm or less.

Through the aforementioned steps, the first single crystal semiconductor layer 110 fixed to the supporting substrate 102 can be obtained. Note that the insulating layer 104, the first electrode 106, and the first impurity semiconductor layer 108 are provided between the supporting substrate 102 and the first single crystal semiconductor layer 110.

The separation substrate 109, i.e., the single crystal semiconductor substrate from which the first single crystal semiconductor layer 110 has been separated can be reused after recycling process. The separation substrate 109 may be reused as a single crystal semiconductor substrate, which serves as a material from which a single crystal semiconductor layer is sliced, or may be used for another purpose. If the substrate is reused as a single crystal semiconductor substrate from which a single crystal semiconductor layer of a photoelectric conversion device is separated, a plurality of photoelectric conversion devices can be manufactured out of one material substrate.

Figure 5A:
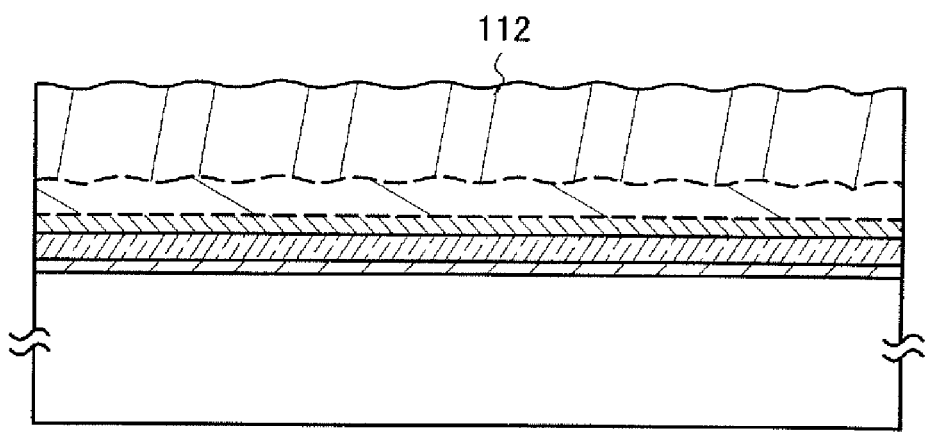
FIGS. 5A and 5B are cross-sectional views showing an example of a method of manufacturing a photoelectric conversion device according to an aspect of the present invention.

The first single crystal semiconductor layer 110 is epitaxially grown to form the second single crystal semiconductor layer 112 (see FIG. 5A). The second single crystal semiconductor layer 112 can be obtained by epitaxially growing the first single crystal semiconductor layer 110 by a plasma CVD method using a mixed gas of a silane based gas (typically silane) and hydrogen as a source gas.

The source gas used for the epitaxial growth includes hydrogen with a flow rate 50 times or more, preferably 100 times or more that of the silane based gas, that is, the silane based gas is diluted with hydrogen. In other words, the dilution ratio of hydrogen to the silane based gas (hydrogen/silane gas) is set 50 times or more, preferably 100 times or more. The silane based gas is typified by silane; alternatively, disilane ($Si_2H_6$) can be used. Further, the source gas may include a rare gas.

As the plasma CVD apparatus used for the epitaxial growth, a high-frequency (RF) plasma CVD apparatus with an electric power frequency of 10 MHz to 200 MHz, typically 13.56 MHz or 60 MHz, or a microwave plasma CVD apparatus with an electric power frequency of 1 GHz to 5 GHz, typically 2.45 GHz is used. The pressure in the chamber is set to be less than or equal to atmospheric pressure, specifically 10 Pa or more and $10^3$ Pa or less.

Here, an example is shown in which single crystal silicon is used as the first single crystal semiconductor layer 110 and the second single crystal semiconductor layer 112 is formed using an RF plasma CVD apparatus. As the RF plasma CVD apparatus, a capacitively coupled (parallel plate) CVD apparatus whose high-frequency power source has an oscillation frequency of 13.56 MHz is used. In an example of a process condition for the epitaxial growth, the flow rate (sccm) of silane and hydrogen, which are a source gas, is $SiH_4:H_2=10:1500$, the pressure in the chamber is 280 Pa, the output electric power of the high-frequency power source is 50 W, and the temperature of a lower electrode is 280° C. In another example of the process condition, the flow rate of silane and hydrogen, which are a source gas, is $SiH_4:H_2=15:1500$, the pressure in the chamber is 280 Pa, the output electric power of the high-frequency power source is 300 W, and the temperature of a lower electrode is 280° C.

The total thickness of the second single crystal semiconductor layer 112 and the first single crystal semiconductor layer 110 is 800 nm or more, preferably 1000 nm or more. In consideration of the productivity such as the process time or the cost, the thickness of the second single crystal semiconductor layer 112 is preferably 100 nm or more and 2000 nm or less.

Before the epitaxial growth is performed on the first single crystal semiconductor layer 110, an oxide layer such as a native oxide layer formed on a surface of the first single crystal semiconductor layer 110 is removed. This is because the oxide layer interrupts the epitaxial growth. The oxide layer can be removed using a solution including fluorinated acid. In specific, the process may be performed using fluorinated acid until the surface of the first single crystal semiconductor layer 110 exhibits a water repellent property. The removal of the oxide layer from the surface of the first single crystal semiconductor layer 110 can be confirmed by repelling of water.

After the single crystal semiconductor layer is formed over the supporting substrate, the epitaxial growth of the single crystal semiconductor layer is performed by a plasma CVD method using a source gas including a silane based gas typified by silane and hydrogen, in which the flow rate of hydrogen is 50 times or more that of the silane based gas. Therefore, the single crystal semiconductor layer can be formed to be thick easily. If the single crystal semiconductor layer is used for a photoelectric conversion layer, the photoelectric conversion efficiency can be improved by the increase in the film thickness.

Figure 5B:
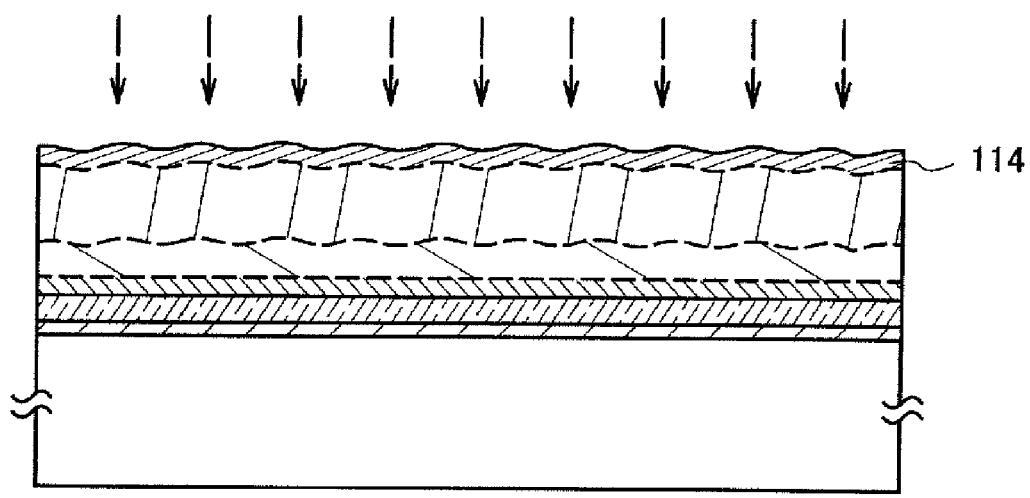

An impurity element imparting a conductivity type opposite to that of the first impurity semiconductor layer 108 is added through the one surface of the second single crystal semiconductor layer 112 (the surface which is not in contact with the first single crystal semiconductor layer 110), whereby the second impurity semiconductor layer 114 is formed (see FIG. 5B). For example, phosphorus or arsenic is added as the impurity element imparting a conductivity type opposite to that of the first impurity semiconductor layer 108, whereby the second impurity semiconductor layer 114 having n type conductivity is formed. If the supporting substrate 102 is a glass substrate, the substrate cannot resist process temperature in a thermal diffusion method; therefore, the impurity element is added by ion implantation or ion doping.

Figure 13A:
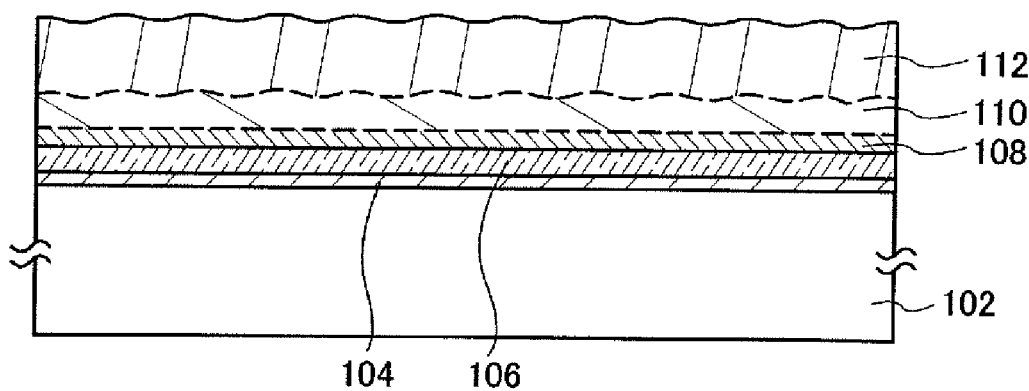
FIGS. 13A and 13B are cross-sectional views showing an example of a method of manufacturing a photoelectric conversion device according to an aspect of the present invention.
Figure 13B:
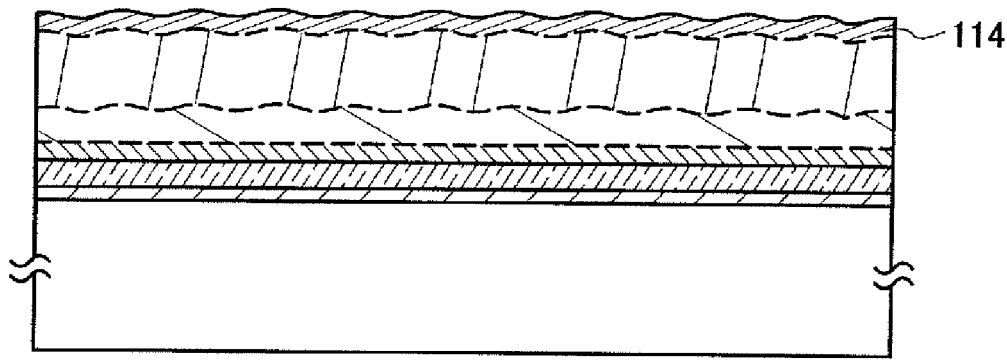

Alternatively, as shown in FIG. 13A, the first single crystal semiconductor layer 110 is epitaxially grown by a plasma CVD method using a source gas in which a silane based gas is diluted with hydrogen; thus, the second single crystal semiconductor layer 112 is formed. Then, as shown in FIG. 13B, the second single crystal semiconductor layer 112 is epitaxially grown by a plasma CVD method using a source gas in which a doping gas including an impurity imparting one conductivity type is added to a silane based gas diluted with hydrogen. Thus, the second impurity semiconductor layer 114 can be formed. As the doping gas, diborane can be used in the case of employing p type conductivity, while phosphine can be used in the case of employing n type conductivity.

Further alternatively, the second impurity semiconductor layer 114 as shown in FIG. 5B can be formed of amorphous semiconductor. Using amorphous semiconductor for the second impurity semiconductor layer 114 does not lead to problems because a region mainly functioning as a photoelectric conversion layer is formed using the single crystal semiconductor layer. In the case of using amorphous semiconductor for the second impurity semiconductor layer 114, the thickness is preferably small, for example 50 nm to 100 nm. This is for the purpose of preventing recombination of carriers in the second impurity semiconductor layer 114.

In this manner, the unit cell 120 can be obtained in which the first impurity semiconductor layer 108 having one conductivity type, the first single crystal semiconductor layer 110, the second single crystal semiconductor layer 112, and the second impurity semiconductor layer 114 having a conductivity type opposite to the one conductivity type are stacked in order.

Figure 6A:
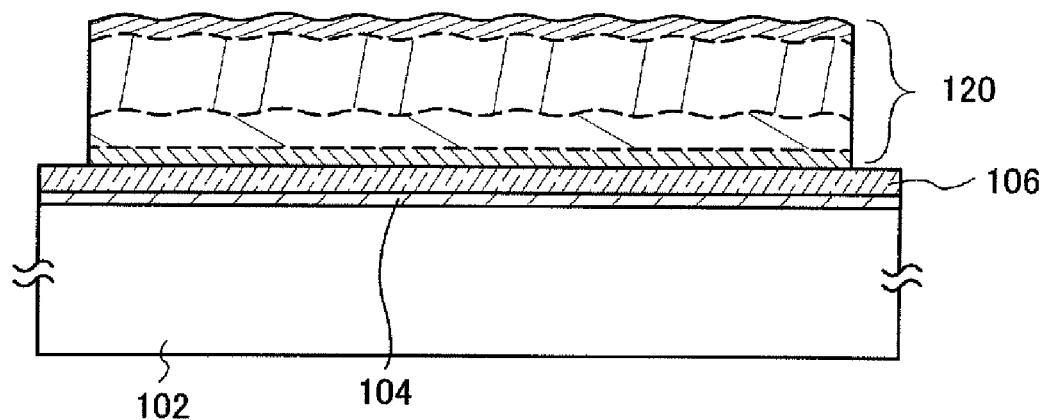
FIGS. 6A and 6B are cross-sectional views showing an example of a method of manufacturing a photoelectric conversion device according to an aspect of the present invention.
Figure 6B:
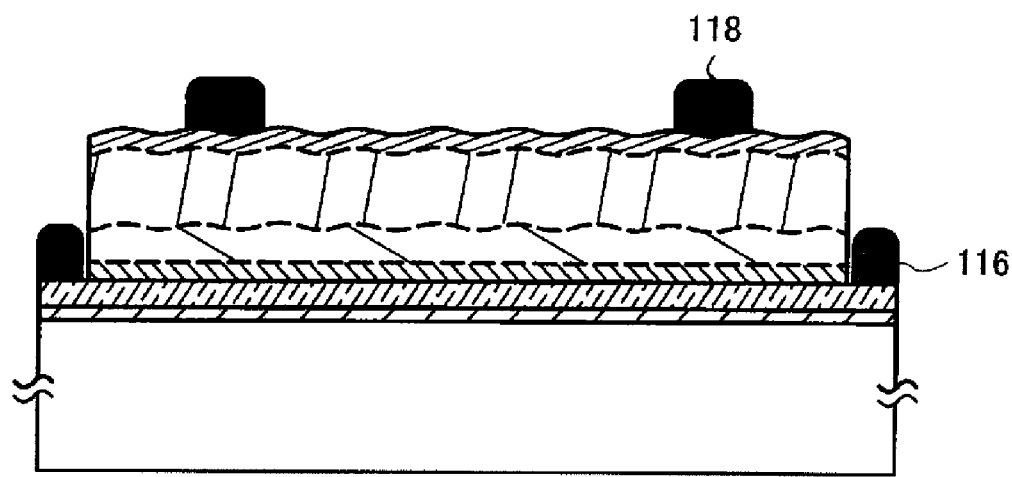

The first impurity semiconductor layer 108, the first single crystal semiconductor layer 110, the second single crystal semiconductor layer 112, and the second impurity semiconductor layer 114 which are provided over the first electrode 106 are selectively etched to expose part of the first electrode 106 (preferably an end portion of the first electrode 106) (see FIG. 6A).

In order to function as the photoelectric conversion device, it is necessary to extract electric energy, which has been converted from light, from electrodes corresponding to a positive electrode and a negative electrode. The first electrode 106 serves as one of electrodes corresponding to a positive electrode and a negative electrode; however, the upper surface of the first electrode 106 is covered with the single crystal semiconductor layers and the lower surface thereof is provided with the supporting substrate 102. Therefore, in this state, electricity is difficult to extract to the outside. Consequently, it is preferable to etch the layers over the first electrode 106 to expose part of the first electrode 106 and to form a leading electrode.

Specifically, a mask is formed using resist or an insulating layer such as a silicon nitride layer over the second impurity semiconductor layer 114, and etching may be performed using the mask. The etching may be dry etching with use of a fluorine based gas such as $NF_3$ or $SF_6$ under the condition where at least the etching selectivity between the first electrode 106 and the layers (the first impurity semiconductor layer 108 to the second impurity semiconductor layer 114) formed over the first electrode 106 is sufficiently high. After the etching, the mask which has rendered unnecessary is removed.

Although this embodiment mode shows the example in which the first electrode 106 is exposed after the formation of the second impurity semiconductor layer 114, the second impurity semiconductor layer 114 can alternatively be formed after the exposure of the first electrode 106. In specific, the second single crystal semiconductor layer 112 is formed by heat treatment, a mask is formed over the second single crystal semiconductor layer 112, and then etching is performed using the mask to expose part of the first electrode 106. After removing the mask which has rendered unnecessary, an impurity element imparting a conductivity type opposite to that of the first impurity semiconductor layer 108 is added to the second single crystal semiconductor layer 112, whereby the second impurity semiconductor layer 114 is formed.

The second electrode 118 is formed over the second impurity semiconductor layer 114. The auxiliary electrode 116 is formed in contact with the exposed part of the first electrode 106 (see FIG. 6B).

The second electrode 118 is formed to have a grid shape (or a comb-like shape or a pectinate shape) when seen from above, as shown in FIG. 2. Thus, the unit cell 120 can be irradiated with light and can absorb light effectively. The shape of the second electrode 118 is not particularly limited; however, it is needless to say that the effective area where light enters increases when the area covering the unit cell 120 (the second impurity semiconductor layer 114) is made as small as possible.

The auxiliary electrode 116 can be formed through the same steps as those for forming the second electrode 118. In the photoelectric conversion device of this embodiment mode, the first electrode 106 functions as one of electrodes corresponding to a positive electrode and a negative electrode. However, the first electrode 106 is formed all over the surface between the supporting substrate 102 and the unit cell 120 and thus wirings cannot be arranged freely. That's why the auxiliary electrode 116 is formed to make it easy to extract the electric energy which has been converted from light. The auxiliary electrode 116 serves as an extraction electrode.

The second electrode 118 and the auxiliary electrode 116 are each formed by a printing method or the like using aluminum, silver, lead-tin (solder), or the like. For example, the second electrode 118 and the auxiliary electrode 116 can be formed using a silver paste by a screen printing method. In the case of forming the electrodes by a screen printing method using paste or the like, the thickness of each electrode can be about several micrometers to several hundreds of micrometers. However, shown is the schematic diagram which does not necessarily illustrate in the actual dimension.

Thus, the photoelectric conversion device 100 can be manufactured.

Figure 8:
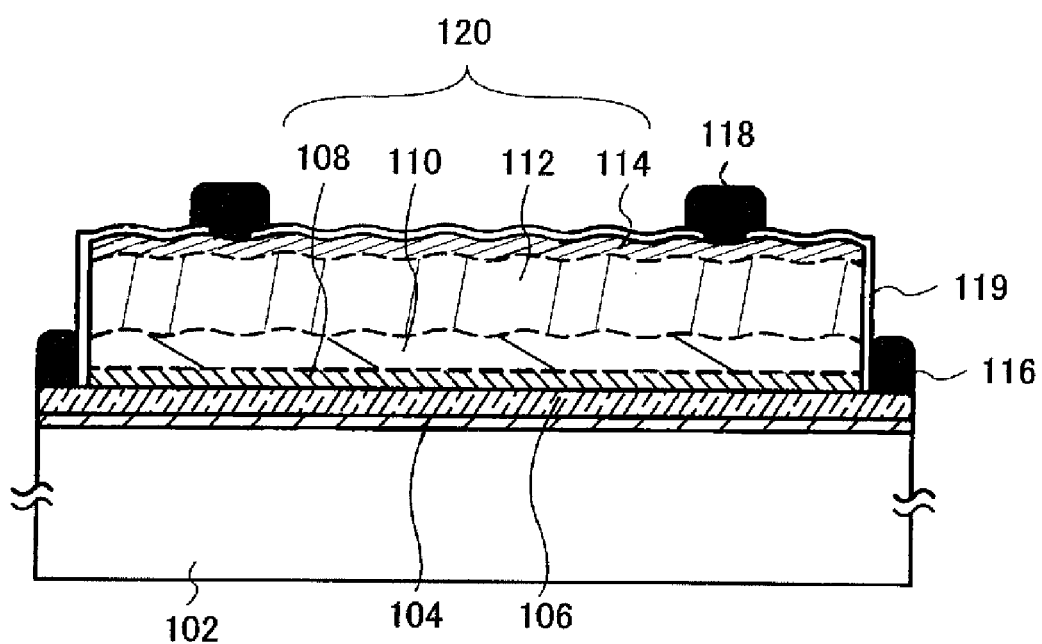
FIG. 8 is a cross-sectional view showing an example of a photoelectric conversion device according to an aspect of the present invention.

Note that a passivation layer 119 which also functions as an antireflection layer is preferably formed over the unit cell 120 (see FIG. 8).

It is said that a semiconductor surface generally has a reflectance of 30% to 50%, though depending on wavelength. The reflection at a light incidence surface leads to loss of incident light, which is a factor of decreasing photoelectric conversion efficiency. Therefore, the passivation layer 119 whose refractive index is between the refractive indices of air and semiconductor, that is, a material of the light incidence surface of the unit cell 120, and whose transmittance does not interrupt light incidence is formed over the light incidence surface of the unit cell 120 (over the second impurity semiconductor layer 114 in this embodiment mode). Thus, the reflection at the incidence surface of the unit cell 120 can be prevented. As the passivation layer 119, a silicon nitride layer, a silicon nitride oxide layer, a magnesium fluoride layer, or the like can be used.

The passivation layer 119 is provided between the unit cell 120 and the second electrode 118 and between the unit cell 120 and the auxiliary electrode 116. In this case, after the passivation layer 119 is formed over the unit cell 120, the passivation layer 119 is etched to form openings so that part of the second impurity semiconductor layer 114 and part of the first electrode 106 are exposed. Alternatively, the passivation layer 119 provided with openings can be formed by a lift-off method or the like. Then, the second electrode 118 is formed by a printing method in contact with the second impurity semiconductor layer 114 through the openings provided in the passivation layer 119. By the same step, the auxiliary electrode 116 is formed in contact with the first electrode 106 through the opening provided in the passivation layer 119.

With the crystal epitaxial growth technique applied in the manufacturing process of this embodiment mode, the single crystal semiconductor layer with a thickness of 800 nm or more, preferably 1000 nm or more which functions as a photoelectric conversion layer can be obtained. By the epitaxial growth, the amount of single crystal semiconductor used as the material can be decreased and the consumption of single crystal semiconductor can therefore be suppressed. In the case of amorphous semiconductor or microcrystal semiconductor, grain boundaries trap carriers to decrease the photoelectric conversion efficiency; in contrast, single crystal semiconductor having no grain boundaries achieves excellent photoelectric conversion efficiency and a highly-efficient photoelectric conversion device can therefore be provided. Further, the structure body portion that supports the photoelectric conversion device has been conventionally formed using single crystal semiconductor. However, with the structure in which a single crystal semiconductor layer sliced from a single crystal semiconductor substrate is fixed to a supporting substrate by a technique of bonding different kinds of materials, the consumption of single crystal semiconductor can be suppressed. Moreover, the single crystal semiconductor substrate from which the single crystal semiconductor layer has been separated can be reused. Therefore, the resources can be effectively used.

Figure 7:
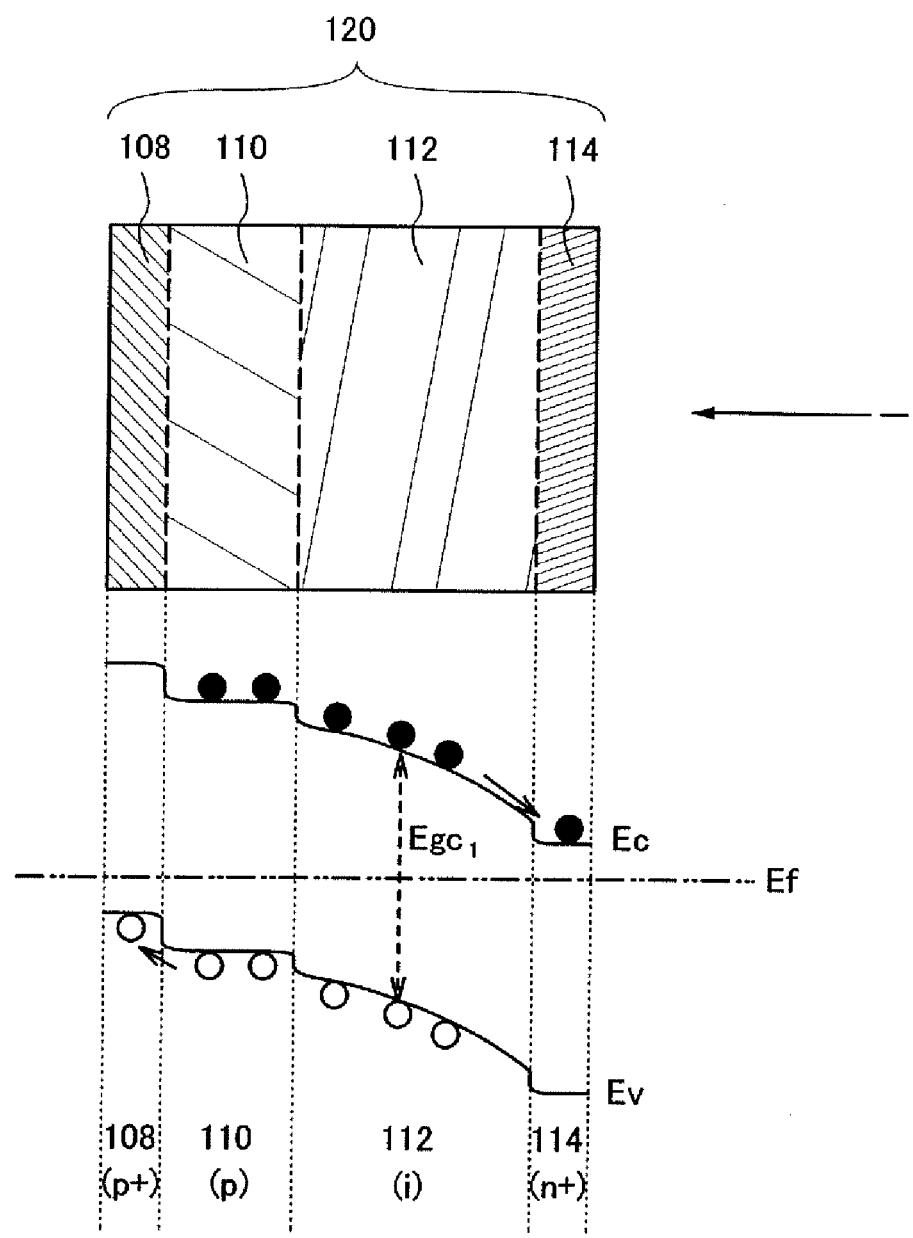
FIG. 7 shows a cross-sectional view of a unit cell of a photoelectric conversion device according to an aspect of the present invention and an energy band diagram corresponding to the unit cell of a photoelectric conversion device.

FIG. 7 shows a cross-sectional schematic view showing an example of the unit cell 120 having the photoelectric conversion device of this embodiment mode. In this unit cell 120, a p+ type first impurity semiconductor layer 108 (a p+ layer), a p type first single crystal semiconductor layer 110 (a p layer), an intrinsic type (i type) second single crystal semiconductor layer 112 (an i layer), and an n+ type (or n type) second impurity semiconductor layer 114 (an n+ layer) are arranged in order. The unit cell 120 includes a single crystal semiconductor layer with an energy gap (Eg) of about 1.1 eV. Light enters from the n+ type second impurity semiconductor layer 114 (the n+ layer) side.

FIG. 7 shows an energy band diagram corresponding to the unit cell 120. In FIG. 7, $Egc_1$ indicates the energy gap of the first single crystal semiconductor layer 110 and the second single crystal semiconductor layer 112, which is about 1.1 eV. Ec indicates the level of the lower limit of a conduction band, Ev indicates the level of the upper limit of a valence band, and Ef indicates Fermi level.

Of the carriers (electrons and holes) generated by optical excitation, electrons flow to the n type semiconductor layer side, whereas holes flow to the p type semiconductor layer side. If a single crystal silicon layer with an energy gap of about 1.1 eV is used as the single crystal semiconductor layer, a thickness of at least 800 nm is necessary to absorb sunlight because single crystal silicon is indirect transition type semiconductor and its light absorption coefficient is low. In this embodiment mode, the increase in thickness of the single crystal semiconductor layer functioning as the photoelectric conversion layer is achieved by the epitaxial growth, and the total thickness of the first single crystal semiconductor layer 110 and the second single crystal semiconductor layer 112 is at least 800 nm. Therefore, light can be absorbed sufficiently in the photoelectric conversion layer, so that the carrier collecting efficiency can be increased to improve photoelectric conversion efficiency.

Further, the second single crystal semiconductor layer 112 is obtained by epitaxially growing the first single crystal semiconductor layer 110, and the unit cell 120 has a structure having pin junction. Accordingly, an internal electric field can be formed with which the carriers are drifted so that the photoelectric conversion efficiency can be improved.

Note that this embodiment mode can be combined with any of the other embodiment modes, as appropriate.

Embodiment Mode 2

This embodiment mode describes an example of a method of manufacturing a photoelectric conversion device, which is different from that in Embodiment Mode 1. Specifically, the example of (1) about the formation order of the fragile layer 105, the first impurity semiconductor layer 108, the first electrode 106, and the insulating layer 104 is described in Embodiment Mode 1; now, examples of (2) to (4) are described in this embodiment mode. Note that a manufacturing process other than the formation order of the fragile layer 105, the first impurity semiconductor layer 108, the first electrode 106, and the insulating layer 104 is based on Embodiment Mode 1; therefore, the description thereof is not made.

First, the example of the aforementioned formation order (2) is described with reference to FIGS. 10A to 10D.

The protection layer 107 is formed on one surface of the single crystal semiconductor substrate 103. Then, the surface of the substrate 103 where the protection layer 107 is formed is irradiated with ions or cluster ions which are generated from a source gas including hydrogen, whereby the fragile layer 105 is formed in a region at a predetermined depth of the single crystal semiconductor substrate 103 (see FIG. 10A).

Figure 10A:
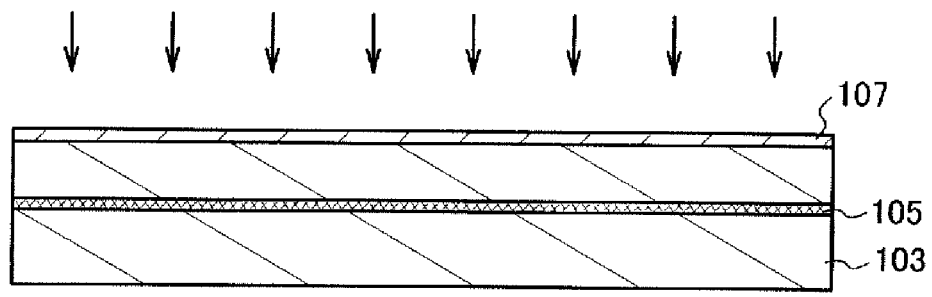
FIGS. 10A to 10D are cross-sectional views showing an example of a method of manufacturing a photoelectric conversion device according to an aspect of the present invention.
Figure 10B:
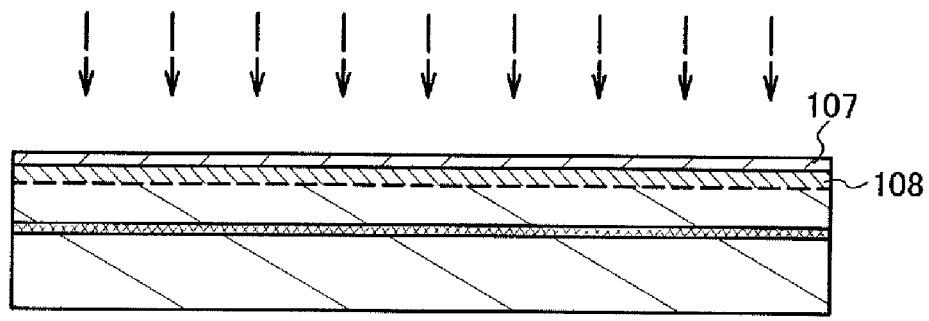
Figure 10C:
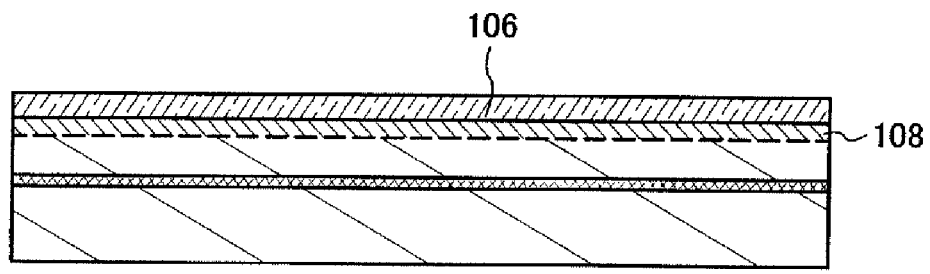

Next, the first impurity semiconductor layer 108 is formed on the one surface side of the single crystal semiconductor substrate 103 by adding an impurity element imparting one conductivity type through the surface where the protection layer 107 is formed (see FIG. 10B). Note that, here, since the fragile layer 105 has already been formed, the addition of the impurity element is performed by an ion implantation method or an ion doping method. This is because a high temperature processing performed in a thermal diffusion method would cause degasification of the fragile layer 105 or separation of the fragile layer 105.

Figure 10D:
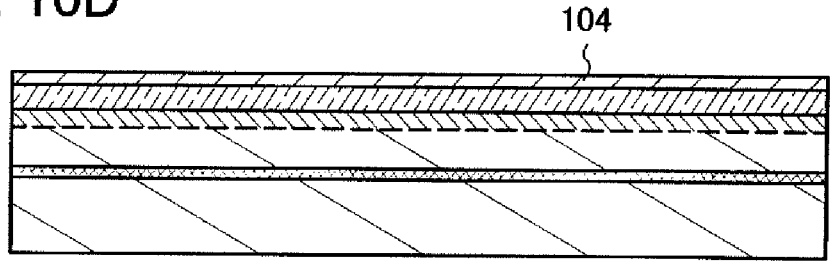

The protection layer 107 is removed and the first electrode 106 is formed (see FIG. 10C), and then the insulating layer 104 is formed over the first electrode 106 (see FIG. 10D). The manufacturing process after this step is based on Embodiment Mode 1, and bonding with a supporting substrate is performed.

By applying the formation order (2), the single crystal semiconductor substrate to which an impurity element is not added is irradiated with the ions or cluster ions to form the fragile layer; thus, variation in a region where the fragile layer is formed can be expected to decrease.

Next, the example of the aforementioned formation order (3) is described with reference to FIGS. 11A to 11D.

Figure 11A:
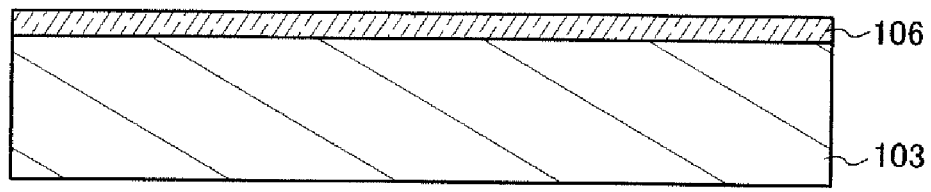
FIGS. 11A to 11D are cross-sectional views showing an example of a method of manufacturing a photoelectric conversion device according to an aspect of the present invention.

The first electrode 106 is formed on one surface of the single crystal semiconductor substrate 103 (see FIG. 11A).

Figure 11B:
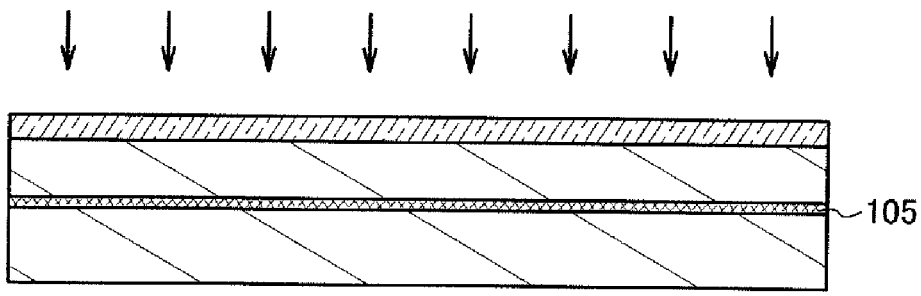

The surface of the single crystal semiconductor substrate 103 where the first electrode 106 is formed is irradiated with ions or cluster ions generated from a source gas including hydrogen, whereby the fragile layer 105 is formed in a region at a predetermined depth of the single crystal semiconductor substrate 103 (see FIG. 11B).

Figure 11C:
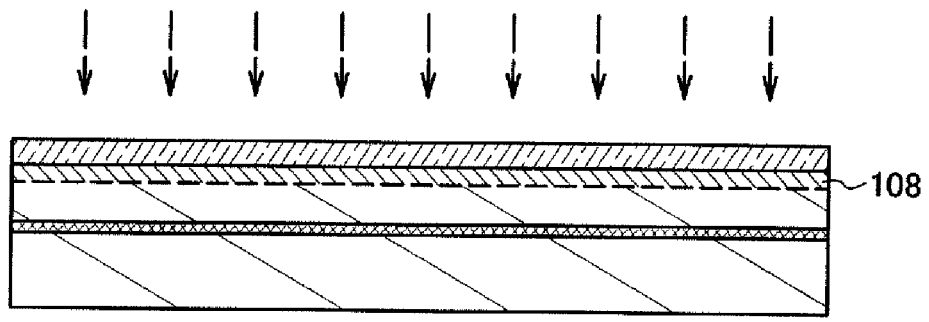

An impurity element imparting one conductivity type is added through the surface of the single crystal semiconductor substrate 103 where the first electrode 106 is formed, whereby the first impurity semiconductor layer 108 is formed on the one surface side (the first electrode 106 side) of the single crystal semiconductor substrate 103 (see FIG. 11C).

Figure 11D:
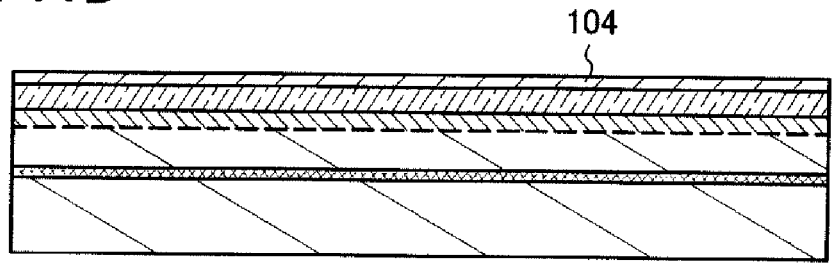

The insulating layer 104 is formed over the first electrode 106 (see FIG. 11D). The manufacturing process after this step is based on Embodiment Mode 1, and bonding with a supporting substrate is performed.

By applying the formation order (3), the first electrode 106 functions as a protection layer against addition of an impurity element or irradiation with ions or cluster ions; therefore, a protection layer does not need to be provided separately. Accordingly, the process can be shortened.

Next, the example of the aforementioned formation order (4) is described with reference to FIGS. 12A to 12D.

Figure 12A:
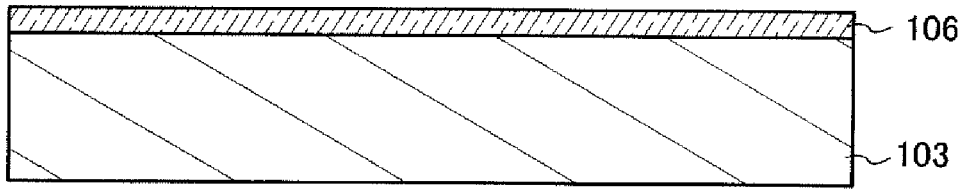
FIGS. 12A to 12D are cross-sectional views showing an example of a method of manufacturing a photoelectric conversion device according to an aspect of the present invention.

The first electrode 106 is formed on one surface of the single crystal semiconductor substrate 103 (see FIG. 12A).

Figure 12B:
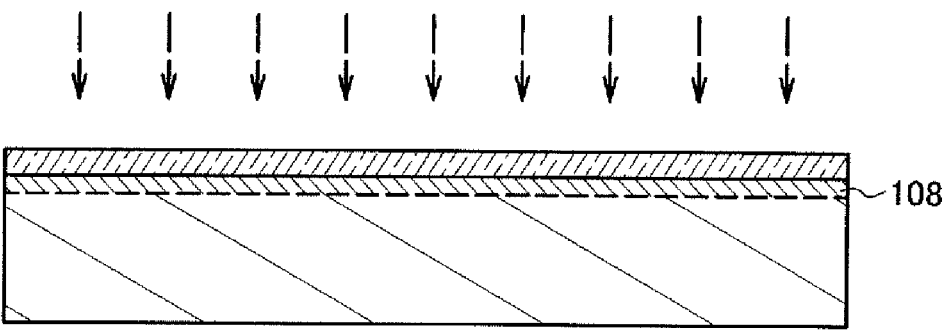

An impurity element imparting one conductivity type is added through the surface of the single crystal semiconductor substrate 103 where the first electrode 106 is formed, whereby the first impurity semiconductor layer 108 is formed on the one surface side (the first electrode 106 side) of the single crystal semiconductor substrate 103 (see FIG. 12B).

Figure 12C:
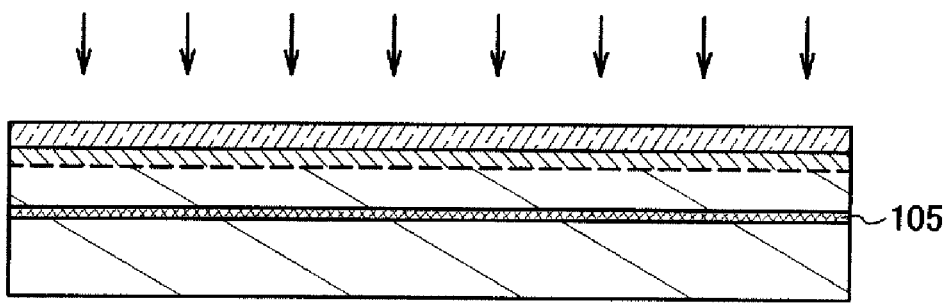

The surface of the single crystal semiconductor substrate 103 where the first electrode 106 is formed is irradiated with ions or cluster ions generated from a source gas including hydrogen, whereby the fragile layer 105 is formed in a region at a predetermined depth of the single crystal semiconductor substrate 103 (see FIG. 12C).

Figure 12D:
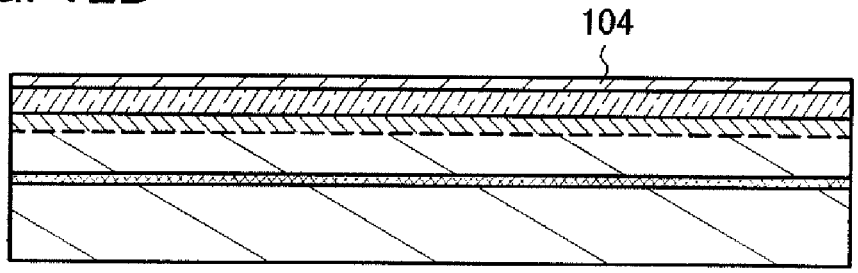

The insulating layer 104 is formed over the first electrode 106 (see FIG. 12D). The manufacturing process after this step is based on Embodiment Mode 1, and bonding with a supporting substrate is performed.

By applying the formation order (4), the first electrode 106 functions as a protection layer against addition of an impurity element or irradiation with ions or cluster ions; therefore, a protection layer does not need to be provided separately. Accordingly, the process can be shortened.

Note that this embodiment mode can be combined with any of the other embodiment modes, as appropriate.

Embodiment Mode 3

This embodiment mode describes an example of a method of manufacturing a photoelectric conversion device, which is different from that in Embodiment Mode 1.

Figure 23:
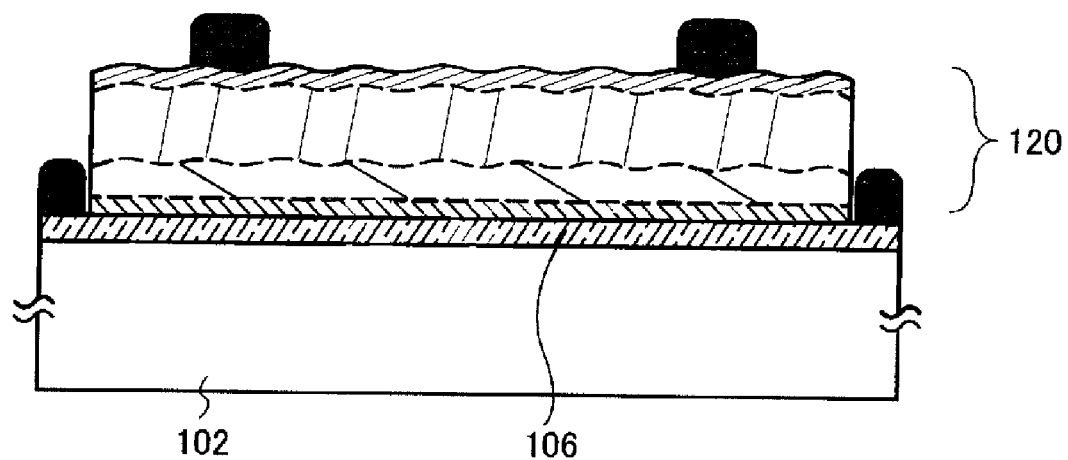
FIG. 23 is a cross-sectional view showing an example of a photoelectric conversion device according to an aspect of the present invention.

FIG. 23 shows an example of a photoelectric conversion device which is formed by directly bonding the first electrode 106 and the supporting substrate 102 to each other. When the first electrode 106 has a smooth surface, specifically, when the first electrode 106 has a surface with an average surface roughness Ra of 0.5 nm or less, preferably, 0.3 nm or less, the first electrode 106 and the supporting substrate can be bonded to each other without formation of the insulating layer 104 shown in FIG. 1. The first electrode 106 is formed, the surface of the first electrode 106 which serves as a bonding plane is sufficiently cleaned, and then the first electrode 106 and the supporting substrate 102 are arranged in close contact to each other to form a bond. Needless to say, before bonding, the bonding plane of the first electrode 106 or the bonding plane of the supporting substrate 102 may be activated. In addition, after the first electrode 106 and the supporting substrate 102 are bonded to each other, heat treatment or pressure treatment may be performed. Since the first electrode 106 having a smooth surface is formed, the insulating layer 104 does not need to be provided separately. Accordingly, the process can be shortened. Even when the first electrode 106 has the average surface roughness in the above range, an insulating layer that functions as a bonding layer may be formed in order to further increase the smoothness of the bonding plane. Further, an insulating layer that functions as a blocking layer may be formed.

Note that this embodiment mode can be combined with any of the other embodiment modes, as appropriate.

Embodiment Mode 4

This embodiment mode describes an example of a method of manufacturing a photoelectric conversion device, which is different from that in Embodiment Mode 1.

Figure 4B:
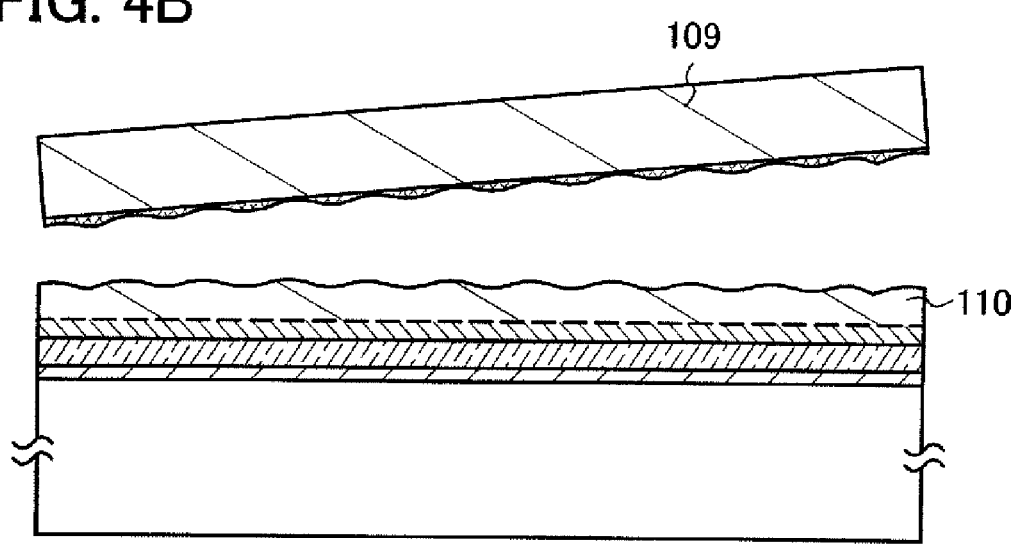

In Embodiment Mode 1, the surface of the first single crystal semiconductor layer 110 which is sliced from the single crystal semiconductor substrate 103 in FIG. 4B, that is, the surface of the first single crystal semiconductor layer 110 serving as a separation plane has a crystal defect remaining due to formation of the fragile layer 105 in some cases. If a single crystal semiconductor layer which forms a photoelectric conversion layer has a defect such as a crystal defect, trapping of carriers or the like occurs, which leads to decrease in photoelectric conversion efficiency. Accordingly, if the first single crystal semiconductor layer 110 has a crystal defect, it is preferable to repair or remove the crystal defect. As a method of repairing or removing the crystal defects, laser processing or etching treatment is preferable.

Figure 20:
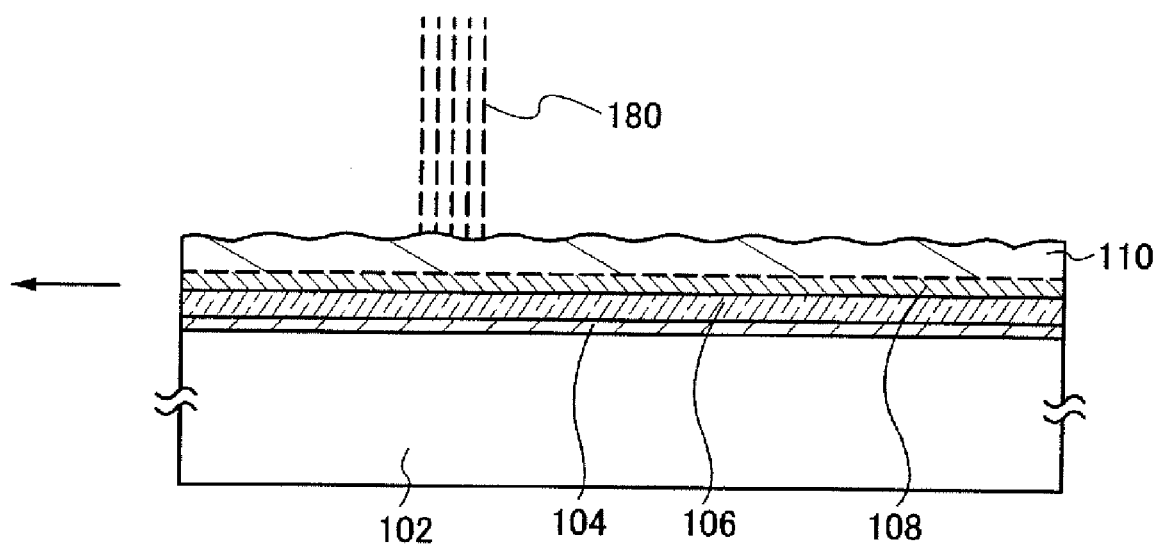
FIG. 20 is a cross-sectional view showing an example of a method of manufacturing a photoelectric conversion device according to an aspect of the present invention.

FIG. 20 shows an example in which laser processing is performed to repair the crystal defect remaining in the first single crystal semiconductor layer 110. The first single crystal semiconductor layer 110 is irradiated with a laser beam. Then, at least the surface side of the first single crystal semiconductor layer 110 is melted and a lower part thereof in a solid-phase state serves as a seed crystal, so that the first single crystal semiconductor layer 110 is recrystallized through a later cooling process to become single crystal. The crystal defect of the first single crystal semiconductor layer 110 can be repaired through the process.

It is preferable that at least a region to be irradiated with a laser beam be heated at 250° C. to 600° C. at the time of the aforementioned laser processing. When the region to be irradiated is heated, the melting time by irradiation with the laser beam can be increased and a defect can be repaired effectively. Although a laser beam 180 melts the surface side of the first single crystal semiconductor layer 110, the supporting substrate 102 is hardly heated; therefore, a substrate with low heat resistance such as a glass substrate can be used as the supporting substrate. In addition, if the first electrode 106 is formed of metal with high melting point, no adverse effect is given on the first single crystal semiconductor layer 110 even when heating is performed at the aforementioned temperature. Silicide is formed at an interface between the first impurity semiconductor layer 108 and the metal that forms the first electrode 106, whereby current flows more easily. In addition, the aforementioned laser processing can also perform activation of the first impurity semiconductor layer 108.

Figure 21:
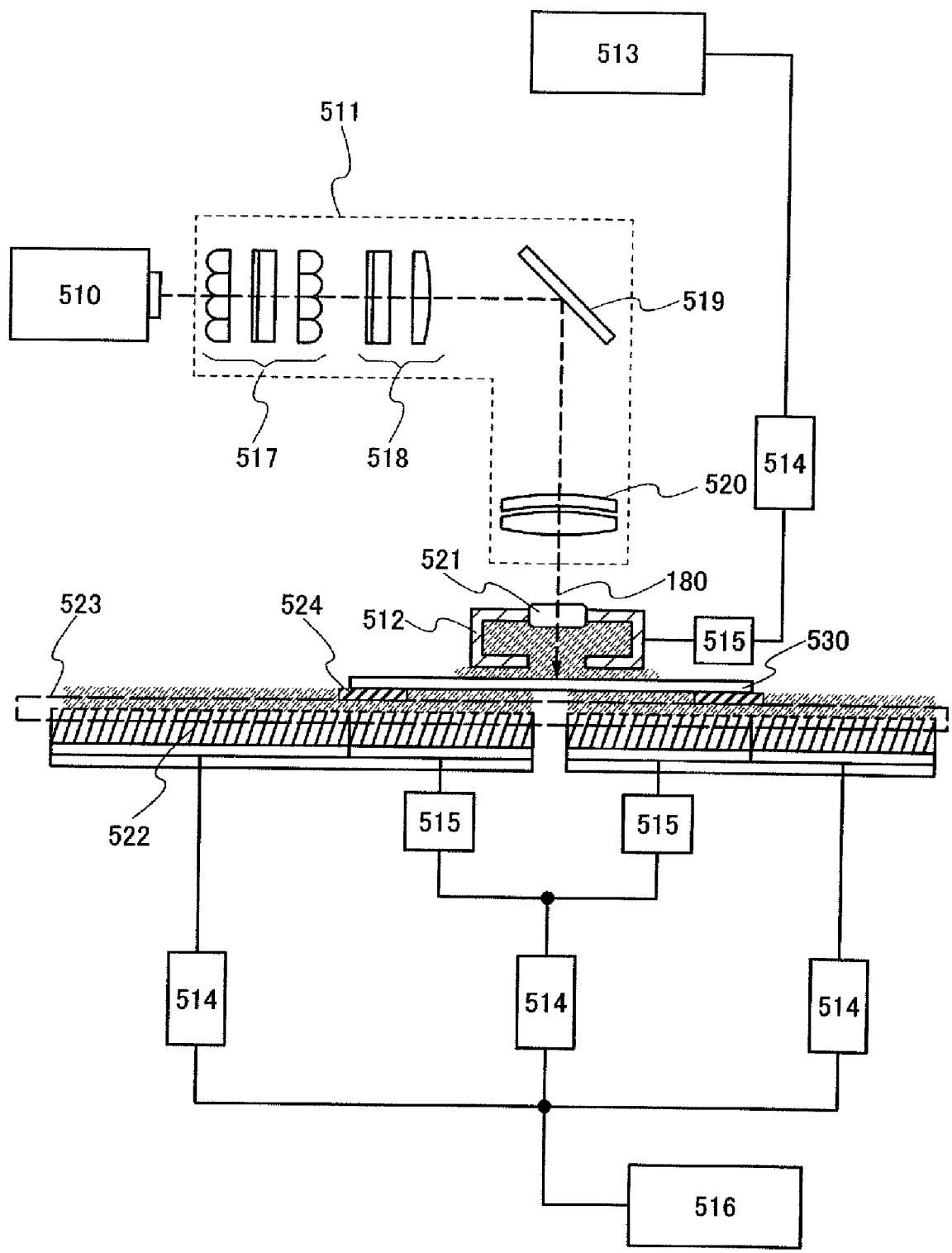
FIG. 21 is a schematic diagram showing a structure of a laser processing apparatus which can be applied to the present invention.

An example of a laser processing apparatus which can perform the aforementioned laser processing is described with reference to FIG. 21. The laser processing apparatus is provided with a laser 510, an optical system 511 by which a laser beam is converged and extended into a narrow linear beam, a gas jet pipe 512 which controls an atmosphere of a region to be irradiated with a laser, a gas supply portion 513 which supplies an atmosphere control gas to the gas jet pipe 512, a flow control portion 514, a gas heat portion 515, a substrate stage 522 which floats and transports an irradiated body 530 (specifically, the supporting substrate 102 to which the first single crystal semiconductor layer 110 is fixed), a guide rail 523 which supports both ends of the substrate and transports the irradiated body 530, and a gas supply portion 516 which supplies to the substrate stage 522, a gas for floating.

As the laser 510, a laser whose emission wavelength is in the range from ultraviolet light to visible light is selected. The laser 510 is preferably a pulsed ArF, KrF, or XeCl excimer laser; or a pulsed solid state laser such as an Nd-YAG laser or a YLF laser; it is preferable that the repetition rate be 1 MHz or less and the pulse width be 10 ns or more and 500 ns or less.

For example, a XeCl excimer laser with a repetition rate of 10 Hz to 300 Hz, a pulse width of 25 ns, and a wavelength of 308 nm is used.

The optical system 511 converges and extends the laser beam to form a laser beam which has a linear cross section on the surface to be irradiated. The optical system 511 which forms a linear beam includes a cylindrical lens array 517, a cylindrical lens 518, a mirror 519, and a doublet cylindrical lens 520. Although depending on the size of each lens, a linear laser beam with a length of about 100 mm to 700 mm in a long-side direction and about 100 µm to 500 µm in a short-side direction can be delivered.

The irradiated body 530 is irradiated with the laser beam converged into a linear shape, through a light introducing window 521 of the gas jet pipe 512. The gas jet pipe 512 is arranged adjacent to the irradiated body 530. A nitrogen gas is supplied to the gas jet pipe 512 from the gas supply portion 513. The nitrogen gas is jetted from an opening of the gas jet pipe 512 that faces the irradiated body 530. The opening of the gas jet pipe 512 is arranged in accordance with an optical axis of the linear laser beam so that the first single crystal semiconductor layer 110 fixed to the supporting substrate 102, which is the irradiated body 530, is irradiated with the laser beam 180 that enters through the light introducing window 521. By the nitrogen gas jetted through the opening of the gas jet pipe 512, the region to be irradiated with the laser beam has a nitrogen atmosphere.

The nitrogen gas supplied to the gas jet pipe 512 is heated by the gas heat portion 515 at 250° C. to 600° C., whereby the temperature of the surface of the irradiated body 530 that is irradiated with the laser beam can be controlled using the heated nitrogen gas. When the region to be irradiated is heated, the melting time by the irradiation with the laser beam can be controlled as described above.

Air or nitrogen from the gas supply portion 516 is supplied to the substrate stage 522 through the flow control portion 514. The gas supplied from the gas supply portion 516 is jetted in a direction from the top surface of the substrate stage 522 to the bottom surface of the supporting substrate 102 of the irradiated body 530, thereby floating the supporting substrate 102. The irradiated body 530 is transported in such a manner that both ends thereof are mounted on sliders 524 that move along the guide rail 523, and the irradiated body 530 is sprayed with a gas from the substrate stage 522 side so that the irradiated body 530 can be transported in a floating condition without a bend. In the laser processing apparatus of this embodiment mode, a nitrogen gas is jetted from the gas jet pipe 512 to the top surface of the supporting substrate 102 of the irradiated body 530; therefore, a bend of the supporting substrate 102 can be prevented by being sprayed with a gas also from the rear side.

The substrate stage 522 may be divided into a portion to be irradiated with the laser and its vicinity, and a region other than those. The portion to be irradiated with the laser and its vicinity of the substrate stage 522 may be sprayed with a nitrogen gas heated by the gas heating portion 515, whereby the supporting substrate 102 can be heated.

The laser processing shown in FIG. 20 is effective in that a defect of the first single crystal semiconductor layer 110 is repaired. That is, in the photoelectric conversion device, carriers (electrons and holes) generated by optical excitation are collected to the electrode that is formed on the surface of the semiconductor layer and are extracted as current. At this time, if there is a defect in the first single crystal semiconductor layer 110, the defect serves as a recombination center, whereby the carriers disappear to cause deterioration of a photoelectric conversion characteristic. Thus, it is effective to repair the defect of the single crystal semiconductor layer by laser processing.

Unevenness may be formed on the surface of the first single crystal semiconductor layer 110 by using a phase shift mask when laser processing is performed. For example, a phase shift mask is used in which phase patterns each with a length of 10 µm on each side are arranged in a checkered form or a checkered flag form when seen from above. The phase shift mask is arranged over the first single crystal semiconductor layer 110, and the laser beam is delivered through the phase shift mask. The energy density of the laser beam per unit area is set at 650 mJ/cm$^2$, for example. The laser beam is delivered through the phase shift mask, whereby the profile of the laser beam can be made steep and the surface can have unevenness reflecting the pattern of the phase shift mask. In this case, the surface of the first single crystal semiconductor layer 110 can have periodic unevenness.

Etching treatment may be performed to remove the crystal defect on the surface of the first single crystal semiconductor layer 110. The etching may be performed by dry etching or wet etching. In addition, the separation plane of the first single crystal semiconductor layer 110 remains uneven with an average surface roughness (Ra) of 7 nm to 10 nm and a peak-to-valley value (PV) of 300 nm to 400 nm, in some cases. Note that the peak-to-valley value refers to the largest difference in height between the peak and the valley. The peak and the valley herein used indicate what "peak" and "valley" defined in JIS B0601 are three-dimensionally extended, and the peak refers to the place where the altitude is the highest in the mountain at a designated plane and the valley refers to the place where the altitude is the lowest in the valley at a designated plane.

The laser processing and the etching treatment may be performed in combination. In any case, the crystal defect is removed or repaired, whereby a cause to deteriorate a photoelectric conversion characteristic can be eliminated.

Note that this embodiment mode can be combined with any of the other embodiment modes, as appropriate.

Embodiment Mode 5

This embodiment mode describes an example of a so-called tandem photoelectric conversion device in which a plurality of unit cells is stacked. This embodiment mode describes a photoelectric conversion device in which two unit cells are stacked.

Figure 14:
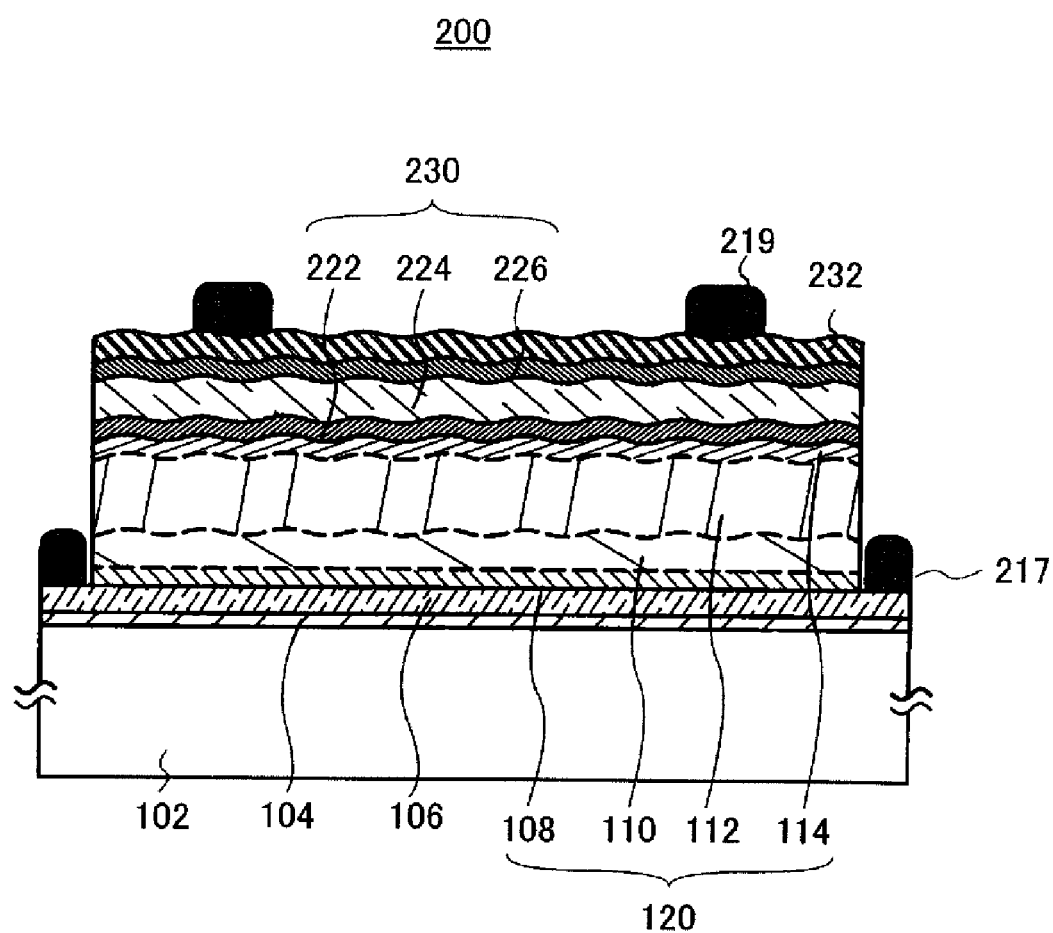
FIG. 14 is a cross-sectional view showing an example of a tandem photoelectric conversion device according to an aspect of the present invention.

FIG. 14 shows an example of a cross-sectional schematic diagram of a tandem photoelectric conversion device 200 of this embodiment mode. The photoelectric conversion device 200 has a structure in which the first unit cell 120 and a second unit cell 230 are stacked over the supporting substrate 102. The first electrode 106 is provided between the supporting substrate 102 and the first unit cell 120, and the insulating layer 104 is provided between the first electrode 106 and the supporting substrate 102. In this embodiment mode, the structure and manufacturing method of the device from the supporting substrate 102 to the first unit cell 120 is based on Embodiment Mode 1, and the description thereof is not repeated.

The photoelectric conversion device 200 has a structure in which light enters from the second unit cell 230 side, and the energy gap of a photoelectric conversion layer of the second unit cell 230 is larger than that of the first unit cell 120. Specifically, the photoelectric conversion layer of the second unit cell 230 is formed of a non-single-crystal semiconductor layer, and the photoelectric conversion layer of the first unit cell 120 is formed of a single crystal semiconductor layer. The photoelectric conversion layers having different energy gaps are stacked, whereby a wavelength range of light that can be absorbed is increased and photoelectric conversion efficiency can be improved. In particular, the wavelengths of sunlight widely range from a short wavelength to a long wavelength, and light of a wide wavelength range can be efficiently absorbed by use of the structure described in this embodiment mode. In addition, a photoelectric conversion layer with a large energy gap is arranged on the light incidence side, whereby light with a short wavelength and a long wavelength can be efficiently absorbed.

The second unit cell 230 has a stacked structure in which a third impurity semiconductor layer 222 having one conductivity type, a non-single-crystal semiconductor layer 224, and a fourth impurity semiconductor layer 226 having a conductivity type opposite to that of the third impurity semiconductor layer 222 are formed in order over the first unit cell 120. The third impurity semiconductor layer 222 has a conductivity type opposite to that of the second impurity semiconductor layer 114 of the first unit cell 120 which is in contact with the third impurity semiconductor layer 222.

Amorphous silicon is typically used for the non-single-crystal semiconductor layer 224 of the second unit cell 230. The third impurity semiconductor layer 222 having one conductivity type and the fourth impurity semiconductor layer 226 having a conductivity type opposite to the one conductivity type are each formed of an amorphous semiconductor layer or a microcrystal semiconductor layer which contains an impurity element having a predetermined conductivity type. Typically, amorphous silicon or microcrystal silicon is used, and amorphous silicon carbide can alternatively be applied. When the third impurity semiconductor layer 222 has p type conductivity, the fourth impurity semiconductor layer 226 has n type conductivity, and it is also possible that the third impurity semiconductor layer 222 has n type conductivity and the fourth impurity semiconductor layer 226 has p type conductivity.

The non-single-crystal semiconductor layer 224 is formed by a plasma CVD method using a silane based gas as a source gas. Specifically, a hydride of silicon typified by silane or disilane, or another silane based gas such as a fluoride of silicon or a chloride of silicon can be used. The silane based gas or the silane based gas including hydrogen and/or a rare gas may be used as the source gas. The non-single-crystal semiconductor layer 224 can be formed using the source gas with use of a plasma CVD apparatus by which a thin film is formed by applying a high-frequency electric power with an electric power frequency of 10 MHz to 200 MHz. Instead of applying the high-frequency electric power, a microwave electric power with an electric power frequency of 1 GHz to 5 GHz, typically 2.45 GHz may be applied. The third impurity semiconductor layer 222 and the fourth impurity semiconductor layer 226 are similarly formed by a plasma CVD apparatus in such a manner that, in the case of forming a p type amorphous semiconductor layer, diborane is added as a doping gas to the source gas. In the case of forming an n type amorphous semiconductor layer, phosphine is added as the doping gas. The amorphous semiconductor layer 224 can alternatively be formed by a sputtering method. The thickness of the non-single-crystal semiconductor layer 224 is 50 nm or more and 300 nm or less, preferably 100 nm or more and 200 nm or less. In the case of applying amorphous silicon for the non-single-crystal semiconductor layer 224, the energy gap is 1.75 eV. With the thickness of the above range, light with a shorter wavelength than 600 nm can be absorbed and converted into electricity.

Note that, instead of an amorphous semiconductor layer, a microcrystal semiconductor layer (typically, microcrystal silicon) can be applied to the non-single-crystal semiconductor layer 224 but in this case, it is preferable that a thin amorphous semiconductor layer of about several nanometer thick be formed over the first unit cell 120 before a microcrystal semiconductor layer is formed. This is because, when a microcrystal semiconductor layer is directly formed on a single crystal semiconductor layer, epitaxial growth proceeds from a single crystal semiconductor to form a single crystal semiconductor layer in some cases. Note that the third impurity semiconductor layer 222 may be formed of a single crystal semiconductor layer; therefore, the thin amorphous semiconductor layer of about several nanometer thick may be formed over the second impurity semiconductor layer 114 or the third impurity semiconductor layer 222.

In the case of using microcrystal silicon for the non-single-crystal semiconductor layer 224, for example, amorphous silicon is formed to a thickness of 5 nm and then, the microcrystal silicon is formed under the condition where a capacitively coupled RF plasma CVD apparatus with an electric power frequency of 13.56 MHz is used, the source gas is silane and hydrogen, the flow rate (sccm) of the silane and hydrogen is $SiH_4:H_2=10:1500$, the pressure in a chamber is 280 Pa, the output electric power of a high-frequency power source is 50 W, and the temperature of a lower electrode is 280° C. In this case, the amorphous silicon layer remains in the second unit cell 230; however, there are no problems because the thickness is very small. Alternatively, the microcrystal silicon can be formed without forming the amorphous silicon in such a manner that a 5-nm-thick silicon layer is formed under the condition where a capacitively coupled RF plasma CVD apparatus with an electric power frequency of 13.56 MHz is used, the source gas is silane and hydrogen, the flow rate of the silane and hydrogen is $SiH_4:H_2=15:1500$ (sccm), the pressure in a chamber is 280 Pa, the output electric power of a high-frequency power source is 300 W, and the temperature of a lower electrode is 280° C., and then the microcrystal silicon is formed under the condition where the flow rate of the source gas is $SiH_4:H_2=10:1500$, the pressure in a chamber is 280 Pa, the output electric power of a high-frequency power source is 50 W, and the temperature of a lower electrode is 280° C.

The first electrode 106 is provided on the supporting substrate 102 side of the first unit cell 120. A second electrode 232 is provided on a surface side of the second unit cell 230. In addition, a first auxiliary electrode 217 is provided in connection with the first electrode 106 and a second auxiliary electrode 219 is provided in connection with the second electrode 232. The first auxiliary electrode 217 and the second auxiliary electrode 219 each function as an extraction electrode (also referred to as a collector electrode) which extracts electric energy converted in the photoelectric conversion layer. The photoelectric conversion device 200 of this embodiment mode has a structure in which electrodes corresponding to a positive electrode and a negative electrode or the extraction electrodes which are connected to these are exposed to the same surface side of the supporting substrate 102.

In this embodiment mode, the second electrode 232 is formed over the entire surface of the second unit cell 230, and the second auxiliary electrode 219 which is in contact with the second electrode 232 is formed in a grid shape (or a pectinate shape). The second unit cell is formed using the non-single-crystal semiconductor layer here, and the lifetime of carriers is short; therefore, it is preferable to form the second electrode 232 over the entire surface of the substrate. Note that the second electrode 232 is formed using a transparent conductive material so that the unit cell absorbs light.

Next, an example of a method of manufacturing the photoelectric conversion device 200 according to this embodiment mode is described with reference to FIGS. 15A and 15B and FIGS. 16A and 16B. Note that since the manufacturing method up to the formation of the second impurity semiconductor layer 114 of the first unit cell 120 is based on Embodiment Mode 1, the description thereof is not made.

Figure 15A:
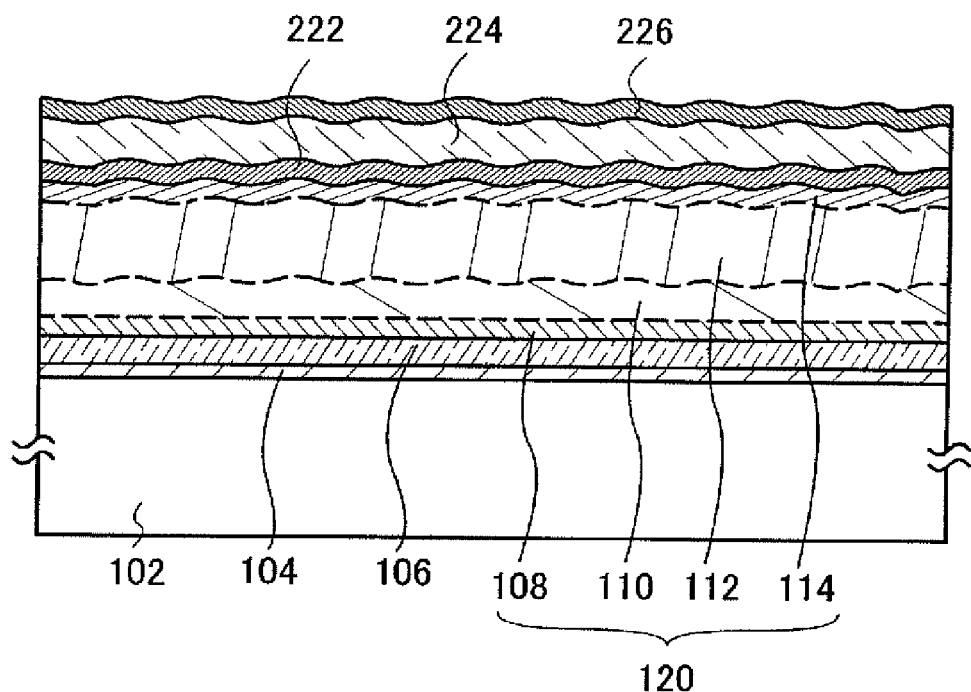
FIGS. 15A and 15B are cross-sectional views showing an example of a method of manufacturing a tandem photoelectric conversion device according to an aspect of the present invention.

The third impurity semiconductor layer 222, the non-single-crystal semiconductor layer 224, and the fourth impurity semiconductor layer 226 are formed in order over the first unit cell 120 (see FIG. 15A).

The third impurity semiconductor layer 222 is formed using an amorphous semiconductor layer or a microcrystal semiconductor layer, which has a conductivity type opposite to that of the second impurity semiconductor layer of the first unit cell 120 that is in contact with the third impurity semiconductor layer 222. Here, a p type amorphous semiconductor layer (e.g., a p type amorphous silicon layer) or a p type microcrystal semiconductor layer (a p type microcrystal silicon layer) is formed. In addition, the third impurity semiconductor layer 222 is formed to have a thickness of 10 nm to 100 nm. The non-single-crystal semiconductor layer 224 is formed using an intrinsic semiconductor layer (an i type amorphous silicon layer) which does not include an impurity element imparting a conductivity type, to a thickness of 100 nm to 300 nm, preferably, 100 nm or more and 200 nm or less. The fourth impurity semiconductor layer 226 is formed using an amorphous semiconductor layer or a microcrystal semiconductor layer having a conductivity type opposite to that of the third impurity semiconductor layer 222. Here, an n type amorphous semiconductor layer (e.g., an n type amorphous silicon layer) or an n type microcrystal semiconductor layer (an n type microcrystal silicon layer) is formed. The fourth impurity semiconductor layer 226 is formed to have a thickness of 10 nm to 100 nm.

The third impurity semiconductor layer 222, the non-single-crystal semiconductor layer 224, and the fourth impurity semiconductor layer 226 are formed by a CVD method or a sputtering method. Preferably, these layers are formed by a plasma CVD method, and as electric power frequency for excitation of plasma, an HF band or a VHF band from 10 MHz to 200 MHz, or microwave from 1 GHz to 5 GHz, for example, 2.45 GHz is applied. As the source gas, a hydride of silicon such as silane or disilane, or a silane based gas such as a fluoride of silicon or a chloride of silicon is used, and hydrogen and/or a rare gas may be mixed as appropriate. When a p type amorphous semiconductor layer or a p type microcrystal semiconductor layer is used, diborane is added to the source gas. Meanwhile, when an n type amorphous semiconductor layer or an n type microcrystal semiconductor layer is used, phosphine is added to the source gas. Note that it is preferable that an impurity element contained in the non-single-crystal semiconductor layer 224 be reduced and oxygen and nitrogen be contained each at $1 \times 10^{19}/cm^3$ or less, preferably, $5 \times 10^{18}/cm^3$ or less.

As described above, the second unit cell 230 can be obtained in which the third impurity semiconductor layer 222 having one conductivity type, the non-single-crystal semiconductor layer 224, and the fourth impurity semiconductor layer 226 having a conductivity type opposite to the one conductivity type are stacked in order.

Figure 15B:
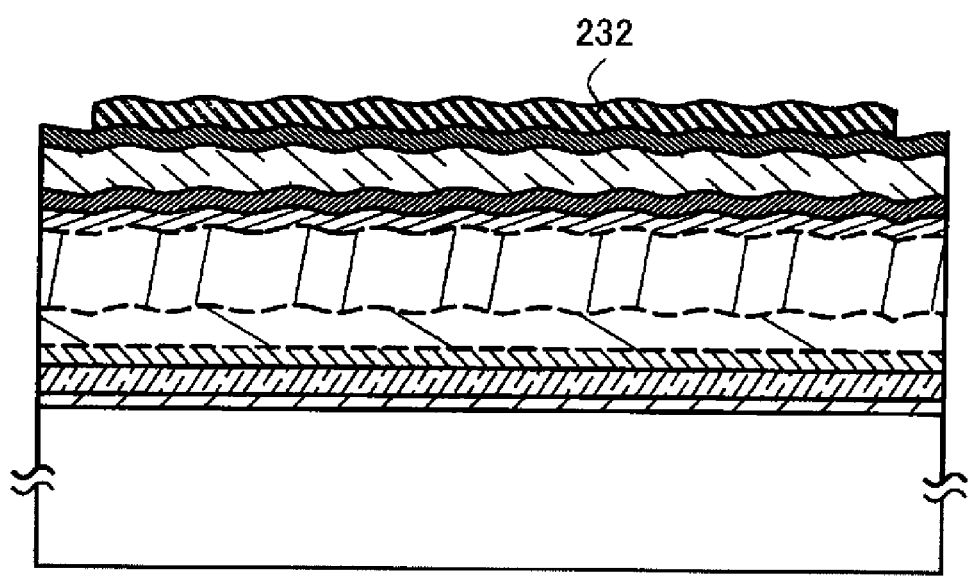

The second electrode 232 is formed over the fourth impurity semiconductor layer 226 (see FIG. 15B). The second electrode 232 is formed using a transparent conductive material. This is because the photoelectric conversion device 200 of this embodiment mode has a structure in which light enters from the second electrode 232 side. As the transparent conductive material, metal oxide such as indium tin oxide (ITO) alloy, zinc oxide, tin oxide, an alloy of indium oxide and zinc oxide, or the like is used. The second electrode 232 has a thickness of 40 nm to 200 nm, preferably, 50 nm to 100 nm. In addition, the sheet resistance of the second electrode 232 may be about 20 Ω/square to 200 Ω/square.

The second electrode 232 is formed by a sputtering method or a vacuum evaporation method. In this embodiment mode, the second electrode 232 is preferably formed using a shadow mask so that the second electrode 232 is selectively formed in a region where the first unit cell 120 and the second unit cell 230 overlap with each other. The second electrode 232 formed selectively can be used as a mask for etching to expose part (preferably an end portion) of the first electrode 106.

Note that, instead of the aforementioned metal oxide, a conductive macromolecular material (also referred to as a conductive polymer) can be used for the second electrode 232. As the conductive macromolecular material, a so-called π electron conjugated macromolecule can be used. For example, polyaniline and/or a derivative thereof, polypyrrole and/or a derivative thereof, polythiophene and/or a derivative thereof, and a copolymer of two or more kinds of those materials can be given.

Figure 16A:
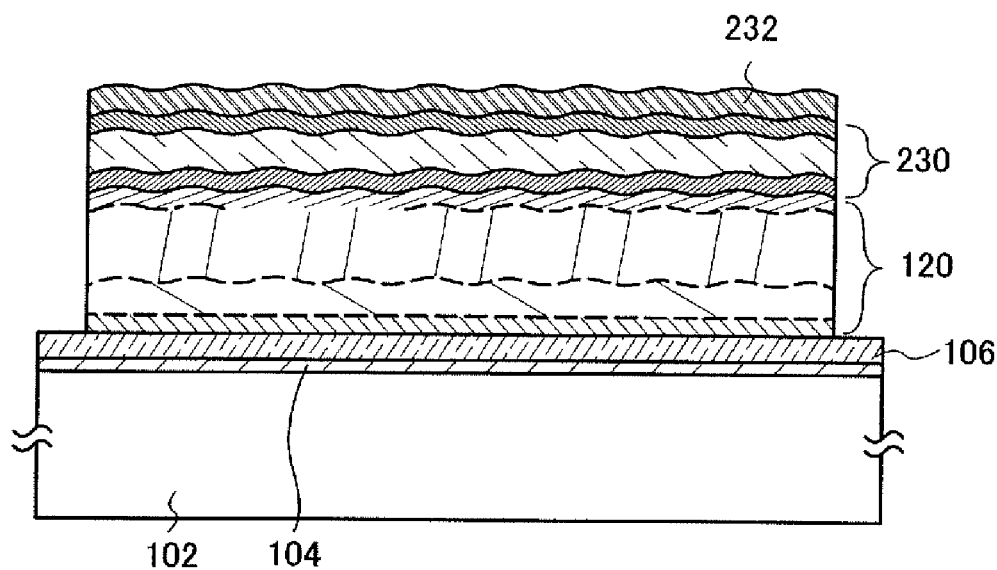
FIGS. 16A and 16B are cross-sectional views showing an example of a method of manufacturing a tandem photoelectric conversion device according to an aspect of the present invention.

The fourth impurity semiconductor layer 226, the non-single-crystal semiconductor layer 224, the third impurity semiconductor layer 222, the second impurity semiconductor layer 114, the second single crystal semiconductor layer 112, the first single crystal semiconductor layer 110, and the first impurity semiconductor layer 108 are etched using the second electrode 232 as a mask to expose the part of the first electrode 106 (see FIG. 16A).

The third impurity semiconductor layer 222, the non-single-crystal semiconductor layer 224, and the fourth impurity semiconductor layer 226 are formed over the entire surface of the supporting substrate 102 by a CVD method or a sputtering method. The second single crystal semiconductor layer 112 and the second impurity semiconductor layer 114 are each formed over the entire surface of the supporting substrate 102 using a single crystal semiconductor layer epitaxially grown by a plasma CVD method with use of a source gas in which a silane based gas is diluted with hydrogen. In the photoelectric conversion device, electric energy converted from light is extracted from the positive electrode and the negative electrode or from the extraction electrodes (collector electrodes) that are electrically connected to the positive and negative electrodes. The first electrode 106 functions as a positive electrode or a negative electrode; however, as shown in FIG. 16A, the upper surface thereof is covered by the single crystal semiconductor layer, and the lower surface thereof is provided with the supporting substrate 102. Accordingly, in this state, it is difficult to extract electric energy from the electrode. Therefore, it is preferable that the layers formed over the first electrode 106 be etched to expose the part of the first electrode 106 and an electrode which can serve as a leading electrode (in this case, the first auxiliary electrode 217) be formed.

The etching may be dry etching using a fluorine based gas such as $NF_3$ or $SF_6$ under the condition where the etching selectivity between at least the first electrode 106 and the layers formed over the first electrode 106 (the first impurity semiconductor layer 108 to the fourth impurity semiconductor layer 226) is sufficiently high. Since the second electrode 232 can be used as a mask here, a new mask for etching is not necessary. Needless to say, a mask can be formed using resist or an insulating layer.

Figure 16B:
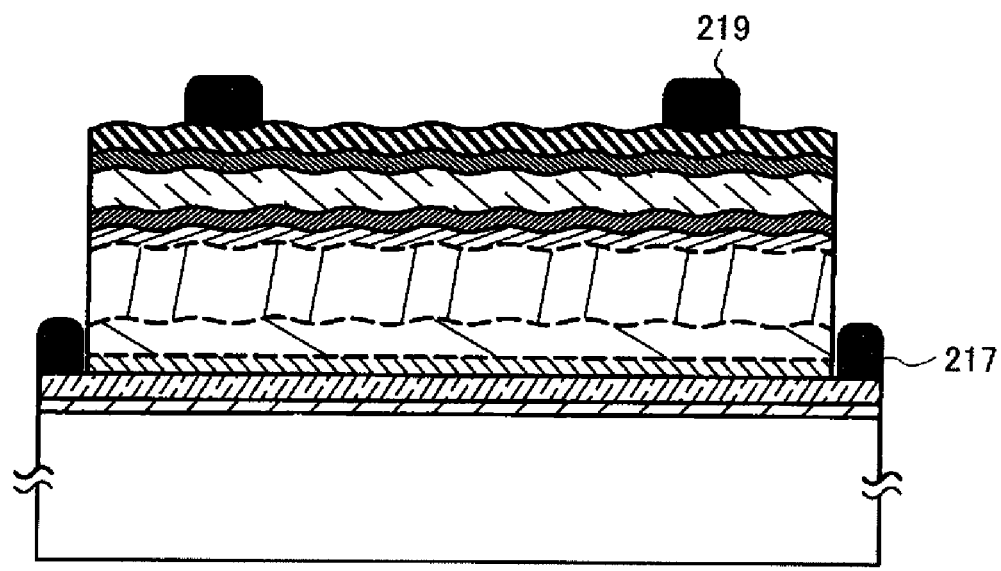

The first auxiliary electrode 217 which is connected to the first electrode 106 and the second auxiliary electrode 219 which is connected to the second electrode 232 are formed (see FIG. 16B).

The second auxiliary electrode 219 is formed so as to have a grid shape (or a comb-like shape or a pectinate shape) shown in FIG. 2 when seen from above. This is because the photoelectric conversion device 200 of this embodiment mode has the structure in which light enters from the second electrode 232 side and because an effective area for light to enter the second unit cell and the first unit cell is increased. In addition, the first auxiliary electrode 217 is formed in contact with the first electrode 106 which is exposed by the former etching.

The first auxiliary electrode and the second auxiliary electrode may be formed using silver, lead-tin (solder), or the like by a printing method. For example, the first auxiliary electrode and the second auxiliary electrode can be formed using a silver paste by a screen printing method.

As described above, the tandem photoelectric conversion device 200 can be formed.

Although not shown here, it is preferable that a passivation layer which serves as an antireflection layer be formed for the tandem photoelectric conversion device 200.

Figure 17:
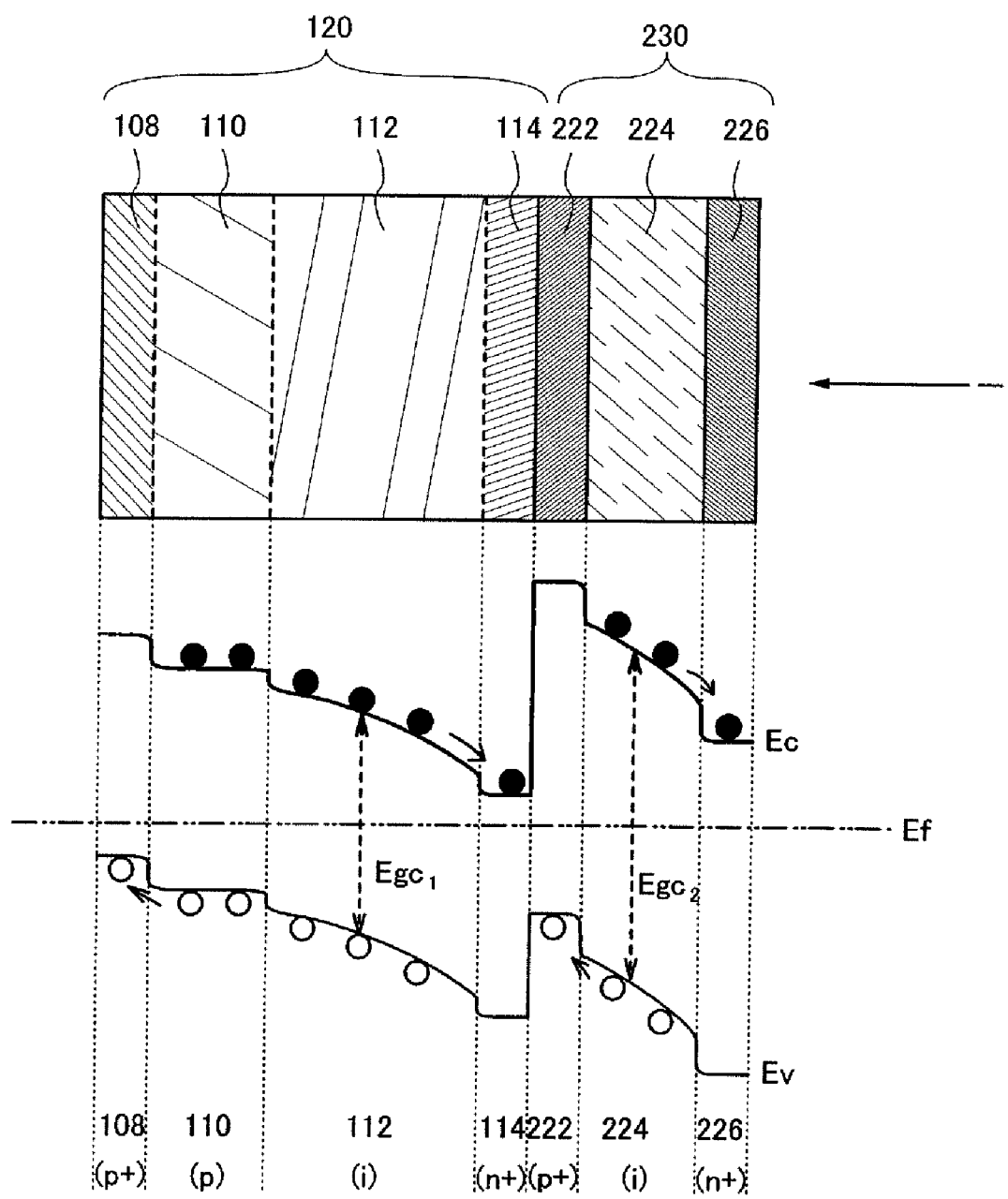
FIG. 17 shows a cross-sectional view of a unit cell of a photoelectric conversion device according to an aspect of the present invention and an energy band diagram corresponding to the unit cell of a photoelectric conversion device.

FIG. 17 shows a cross-sectional schematic diagram showing an example of the first unit cell 120 and the second unit cell 230 included in the photoelectric conversion device of this embodiment mode. In this example, the first unit cell 120 includes a p+ type first impurity semiconductor layer 108 (a p+ layer), a p type first single crystal semiconductor layer 110 (a p layer), an intrinsic second single crystal semiconductor layer 112 (an i layer), and an n+ type (or n type) second impurity semiconductor layer 114 (an n+ layer); and the second unit cell 230 includes a p type third impurity semiconductor layer 222, an intrinsic (i type) non-single-crystal semiconductor layer 224, and an n+ type fourth impurity semiconductor layer 226. In addition, the first unit cell 120 includes a single crystal semiconductor layer having an energy gap of 1.12 eV; the second unit cell 230 includes a non-single-crystal semiconductor layer having an energy gap of 1.75 eV. Note that light enters from the n+ type fourth impurity semiconductor layer 226 (the n+ layer) side. Accordingly, the second unit cell 230 having a non-single-crystal semiconductor layer with a large energy gap is located on the light incidence side and the first unit cell 120 having a single crystal semiconductor layer with a small energy gap is arranged behind the second unit cell 230.

FIG. 17 shows an energy band diagram corresponding to the first unit cell 120 and the second unit cell 230. In the diagram, $Egc_1$ indicates the energy gap of the first single crystal semiconductor layer 110 and the second single crystal semiconductor layer 112, which is about 1.1 eV. $Egc_2$ indicates the energy gap of the non-single-crystal semiconductor layer 224, which is about 1.8 eV. Ec indicates the level of the lower limit of a conduction band, Ev indicates the level of the upper limit of a valence band, and Ef indicates Fermi level.

As shown in the band diagram of FIG. 17, electrons of carriers generated by optical excitation flow to the n type semiconductor layer side and holes of carriers generated by optical excitation flow to the p type semiconductor layer side. A p-n junction is formed at a connection portion of the first unit cell 120 and the second unit cell 230, and a diode is inserted in a direction opposite to the direction of current flow from the aspect of an equivalent circuit. In this case, a recombination center is formed at the bonding interface between the second impurity semiconductor layer 114 and the third impurity semiconductor layer 222, and recombination current flows at this bonding interface. The second impurity semiconductor layer 114 is a single crystal semiconductor, and an amorphous semiconductor layer or a microcrystal semiconductor layer is formed as the third impurity semiconductor layer 222 over the second impurity semiconductor layer 114 by a CVD method or a sputtering method, whereby the bonding by which recombination current flows at the bonding interface can be formed.

As described above, in the tandem photoelectric conversion device, when the first unit cell 120 having a single crystal semiconductor layer is used as a bottom cell, light with a long wavelength of 800 nm or more can be absorbed and converted into electricity, which contributes to improvement in photoelectric conversion efficiency. In addition, when the second unit cell 230 having a non-single-crystal semiconductor layer is used as a top cell, light with a shorter wavelength than 800 nm can be absorbed and converted into electricity, which contributes to improvement in photoelectric conversion efficiency.

In the manufacturing process according to this embodiment mode, a single crystal semiconductor layer having a thickness of 800 nm or more that functions as a photoelectric conversion layer can be obtained by employing a crystal epitaxial growth technique. The consumption of single crystal semiconductor used as a raw material can be suppressed by utilizing epitaxial growth. In addition, a single crystal semiconductor layer which is formed by slicing a single crystal semiconductor substrate is epitaxially grown; therefore, the single crystal semiconductor substrate from which the single crystal semiconductor layer has been separated can be reused. Accordingly, resources can be utilized effectively.

The photoelectric conversion device according to this embodiment mode has the structure in which the unit cells having different energy gaps are stacked, and the unit cell having a photoelectric conversion layer with a large energy gap is arranged on the light incidence side. The unit cells having different energy gaps are combined, whereby the wavelength range of light that is absorbed by the photoelectric conversion device can be wider, and sunlight that covers a wide wavelength range can be efficiently absorbed. Accordingly, the photoelectric conversion characteristic can be improved.

Note that this embodiment mode can be combined with any of the other embodiment modes, as appropriate.

Embodiment Mode 6

In this embodiment mode, a photoelectric conversion device in which a plurality of unit cells is stacked, specifically, a so-called stacked photoelectric conversion device 300 in which three unit cells are stacked is described.

Figure 18:
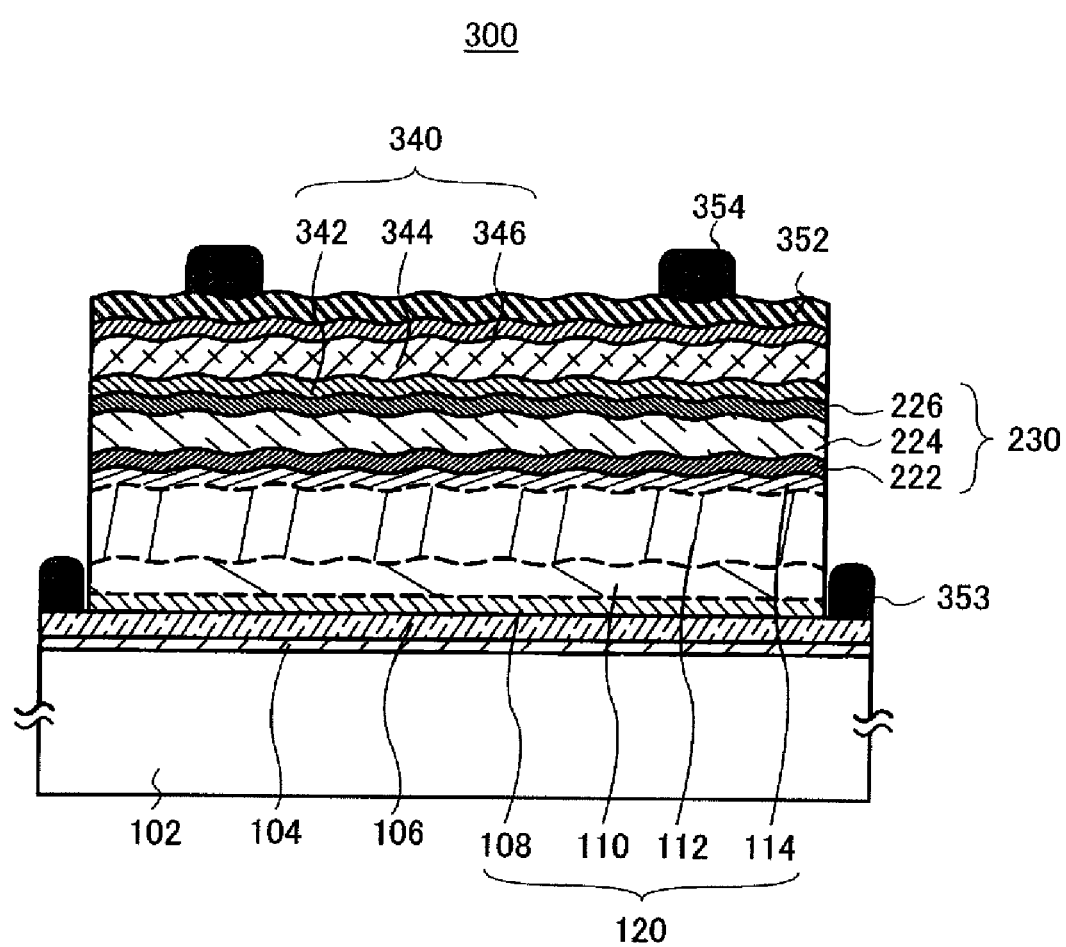
FIG. 18 is a cross-sectional view showing an example of a stacked photoelectric conversion device according to an aspect of the present invention.

FIG. 18 is a cross-sectional schematic diagram of an example of the stacked photoelectric conversion device 300 in which three unit cells are stacked. The photoelectric conversion device 300 has a structure in which the first unit cell 120 using a single crystal semiconductor layer as a photoelectric conversion layer, the second unit cell 230 using a non-single-crystal semiconductor layer as a photoelectric conversion layer, and a third unit cell 340 using a non-single-crystal semiconductor layer as a photoelectric conversion layer are stacked in order over the supporting substrate 102. The first electrode 106 is provided between the supporting substrate 102 and the first unit cell 120, and the insulating layer 104 is provided between the first electrode 106 and the supporting substrate 102. In addition, a first auxiliary electrode 353 is selectively provided in contact with the first electrode 106. A second electrode 352 is provided over the third unit cell 340, and a second auxiliary electrode 354 is selectively provided in contact with the second electrode 352.

The photoelectric conversion device 300 preferably has a structure in which light enters from the third unit cell 340 side, and it is preferable to arrange the photoelectric conversion layers so that energy gaps of the photoelectric conversion layers decrease from the third unit cell 340 side. For example, when the first single crystal semiconductor layer 110 and the second single crystal semiconductor layer 112 of the first unit cell 120 are formed of single crystal silicon having an energy gap of 1.12 eV, the non-single-crystal semiconductor layer 224 of the second unit cell 230 located closer to the light incidence side than the first unit cell 120 preferably has an energy gap larger than 1.12 eV, and a non-single-crystal semiconductor layer 344 of the third unit cell 340 located further closer to the light incidence side preferably has the largest energy gap. The unit cells have different energy gaps and are arranged so that the energy gaps decrease from the light incidence side, whereby the unit cells can absorb light with different wavelength ranges and sunlight can be absorbed efficiently.

Amorphous silicon germanium or the like is used for the non-single-crystal semiconductor layer 224 of the second unit cell 230 to have an energy gap of 1.45 eV to 1.65 eV as described above. In addition, amorphous silicon or amorphous silicon carbide are used for the non-single-crystal semiconductor layer 344 of the third unit cell 340 to have an energy gap of 1.7 eV to 2.0 eV.

The structure and manufacturing method of the device from the supporting substrate 102 to the second unit cell 230 is based on Embodiment Modes 1 to 5, and the description thereof is not made or is simplified.

After the process up to the formation of the first unit cell 120 is performed, the third impurity semiconductor layer 222, the non-single-crystal semiconductor layer 224, and the fourth impurity semiconductor layer 226 which form the second unit cell 230 are formed. Then, a fifth impurity semiconductor layer 342 having one conductivity type, the non-single-crystal semiconductor layer 344, and a sixth impurity semiconductor layer 346 having a conductivity type opposite to the one conductivity type are formed over the second unit cell 230, thereby forming the third unit cell 340. The fifth impurity semiconductor layer 342 has a conductivity type which is opposite to that of the fourth impurity semiconductor layer 226 of the second unit cell 230 which is in contact with the fifth impurity semiconductor layer 342.

The fifth impurity semiconductor layer 342 of the third unit cell 340 is similar to the third impurity semiconductor layer 222 of the second unit cell 230, and the sixth impurity semiconductor layer 346 is similar to the fourth impurity semiconductor layer 226. That is, when the fifth impurity semiconductor layer 342 has p type conductivity, the sixth impurity semiconductor layer 346 has n type conductivity, and when the fifth impurity semiconductor layer 342 has n type conductivity, the sixth impurity semiconductor layer 346 has p type conductivity. When a p type impurity semiconductor layer is used, diborane may be added to a source gas; on the other hand, when an n type impurity semiconductor layer is used, phosphine may be added to a source gas.

Figure 19:
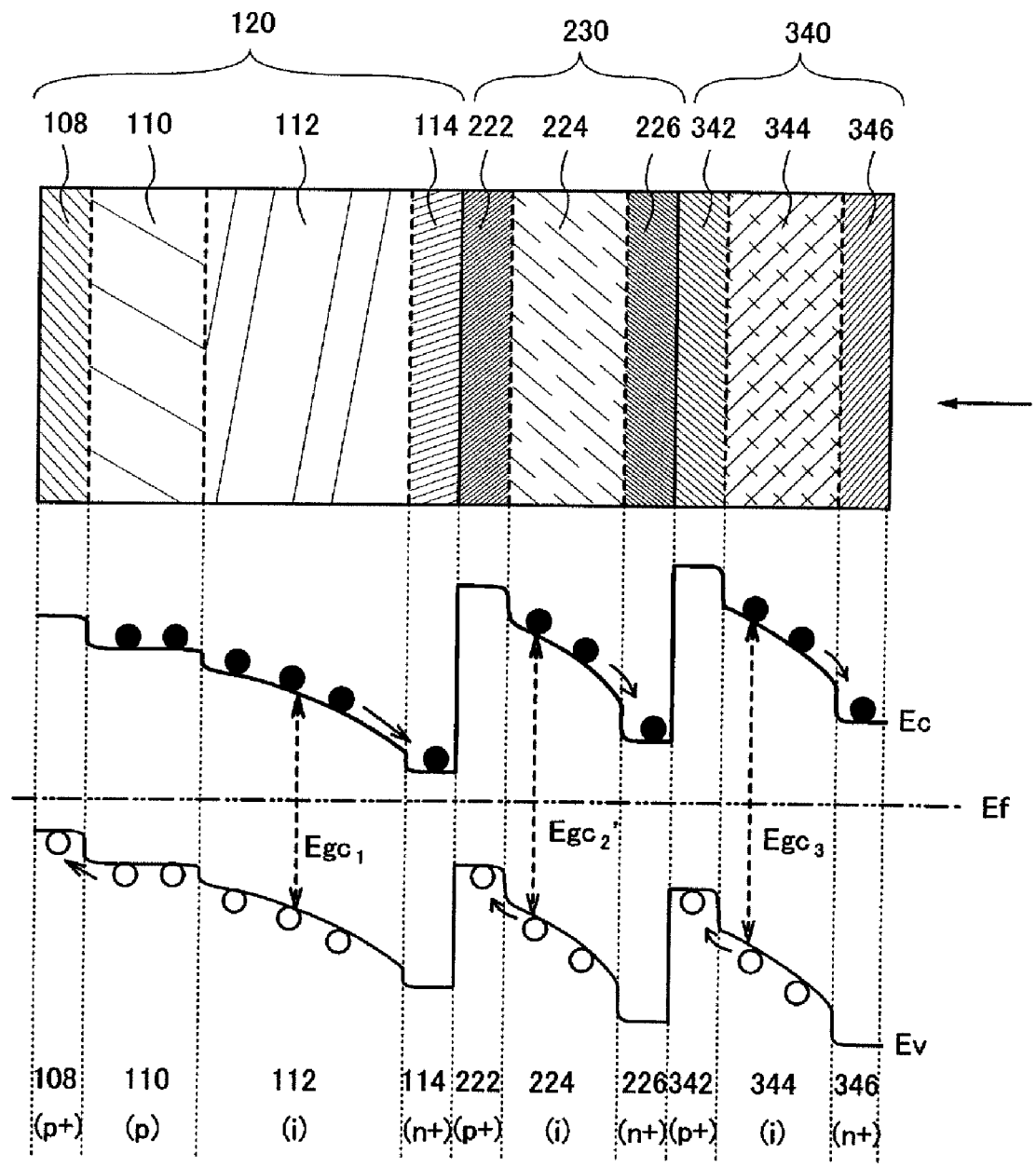
FIG. 19 shows a cross-sectional view of a unit cell of a stacked photoelectric conversion device according to an aspect of the present invention and an energy band diagram corresponding to the unit cell of the stacked photoelectric conversion device.

Here, FIG. 19 shows a cross-sectional schematic diagram showing an example of the first unit cell 120, the second unit cell 230, and the third unit cell 340 included in the photoelectric conversion device of this embodiment mode. In this example, the first unit cell 120 includes a p+ type first impurity semiconductor layer 108 (a p+ layer), a p type first single crystal semiconductor layer 110 (a p layer), an intrinsic second single crystal semiconductor layer 112 (an i layer), and an n+ type (or n type) second impurity semiconductor layer 114 (an n+ layer). In this example, moreover, the second unit cell 230 includes a p type third impurity semiconductor layer 222, an intrinsic (i type) non-single-crystal semiconductor layer 224, and an n+ type fourth impurity semiconductor layer 226. The third unit cell 340 includes a p type fifth impurity semiconductor layer 342, an intrinsic (i type) non-single-crystal semiconductor layer 344 (an i layer), and an n+ type (or n type) sixth impurity semiconductor layer 346 (an n+ layer).

FIG. 19 shows an energy band diagram corresponding to the first unit cell 120, the second unit cell 230, and the third unit cell. In the diagram, $Egc_1$ indicates an energy gap of the first single crystal semiconductor layer 110 and the second single crystal semiconductor layer 112, $Egc_{2'}$ indicates an energy gap of the non-single-crystal semiconductor layer 224, and $Egc_3$ indicates an energy gap of the non-single-crystal semiconductor layer 344. Ec indicates the level of the lower limit of a conduction band, Ev indicates the level of the upper limit of a valence band, and Ef indicates Fermi level. In addition, the first unit cell 120 includes a single crystal semiconductor layer having an energy gap of $Egc_1$, the second unit cell 230 includes a non-single-crystal semiconductor layer having an energy gap of $Egc_2$, which is larger than $Egc_1$, and the third unit cell 340 includes a non-single-crystal semiconductor layer having an energy gap of $Egc_3$ which is larger than $Egc_{2'}$. Note that light enters from the n+ type sixth impurity semiconductor layer 346 (an n+ layer) side. Accordingly, the unit cells having photoelectric conversion layers are arranged in such a manner that their energy gaps decrease from the light incidence side.

As shown in the band diagram of FIG. 19, electrons of carriers generated by optical excitation flow to the n type semiconductor layer side and holes of carriers generated by optical excitation flow to the p type semiconductor layer side. A p-n junction is formed at a connection portion of the first unit cell 120 and the second unit cell 230, and a diode is inserted in a direction opposite to the direction of current flow from the aspect of an equivalent circuit. In this case, a recombination center is formed at the bonding interface between the second impurity semiconductor layer 114 and the third impurity semiconductor layer 222, and recombination current flows at this bonding interface. The second impurity semiconductor layer 114 is a single crystal semiconductor, and an amorphous semiconductor layer or a microcrystal semiconductor layer is formed as the third impurity semiconductor layer 222 over the second impurity semiconductor layer 114 by a CVD method or the like, whereby the bonding by which recombination current flows at the bonding interface can be formed. A p-n junction is also formed at a connection portion of the second unit cell 230 and the third unit cell 340, and a diode is inserted in a direction opposite to the direction of current flow from the aspect of an equivalent circuit. In this case, a recombination center is formed at the bonding interface between the fourth impurity semiconductor layer 226 and the fifth impurity semiconductor layer 342, and recombination current flows at this bonding interface.

As described above, in the stacked photoelectric conversion device, the wavelength range of light that is absorbed can be wider, which contributes to improvement in photoelectric conversion efficiency.

Note that this embodiment mode can be combined with any of the other embodiment modes, as appropriate.

Embodiment Mode 7

Figure 24A:
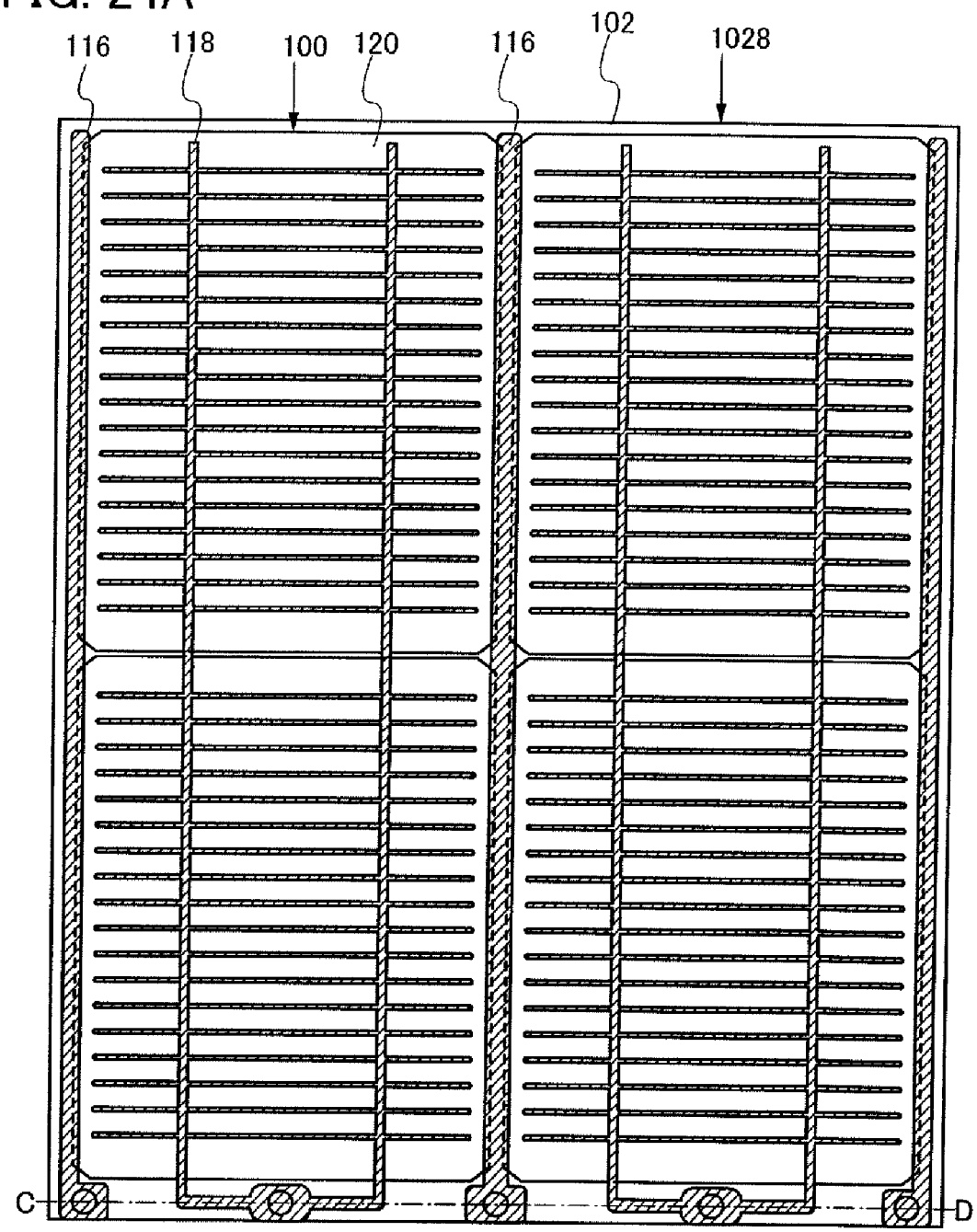
FIGS. 24A and 24B are schematic diagrams for illustrating a structure of a photovoltaic power generation module.

A photovoltaic power generation module can be manufactured using the photoelectric conversion device obtained by Embodiment Modes 1 to 6. In this embodiment mode, an example of a photovoltaic power generation module using the photoelectric conversion device described in Embodiment Mode 1 is shown in FIG. 24A. A photovoltaic power generation module 1028 includes the unit cell 120 provided on one surface of the supporting substrate 102. Between the supporting substrate 102 and the unit cell 120, the insulating layer 104 and the first electrode 106 are provided in order from the supporting substrate 102 side. The first electrode 106 is connected to the auxiliary electrode 116.

Figure 24B:
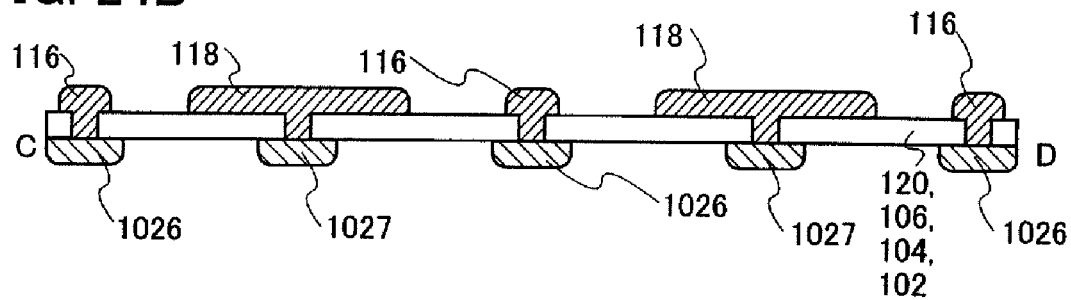

The auxiliary electrode 116 and the second electrode 118 are formed on the one surface side of the supporting substrate 102 (the side where the unit cell 120 is formed) and are connected to a first back surface electrode 1026 and a second back surface electrode 1027 which are used for a connector, respectively in end regions of the supporting substrate 102. FIG. 24B is a cross-sectional view along a line C-D. The auxiliary electrode 116 is connected to the first back surface electrode 1026 through a penetration opening of the supporting substrate 102, and the second electrode 118 is connected to the second back surface electrode 1027 through a penetration opening of the supporting substrate 102.

In this manner, the supporting substrate 102 is provided with the unit cell 120 to form the photoelectric conversion device 100. Thus, the photovoltaic power generation module 1028 can be made thin.

Note that this embodiment mode can be combined with any of the other embodiment modes, as appropriate.

Embodiment Mode 8

Figure 25:
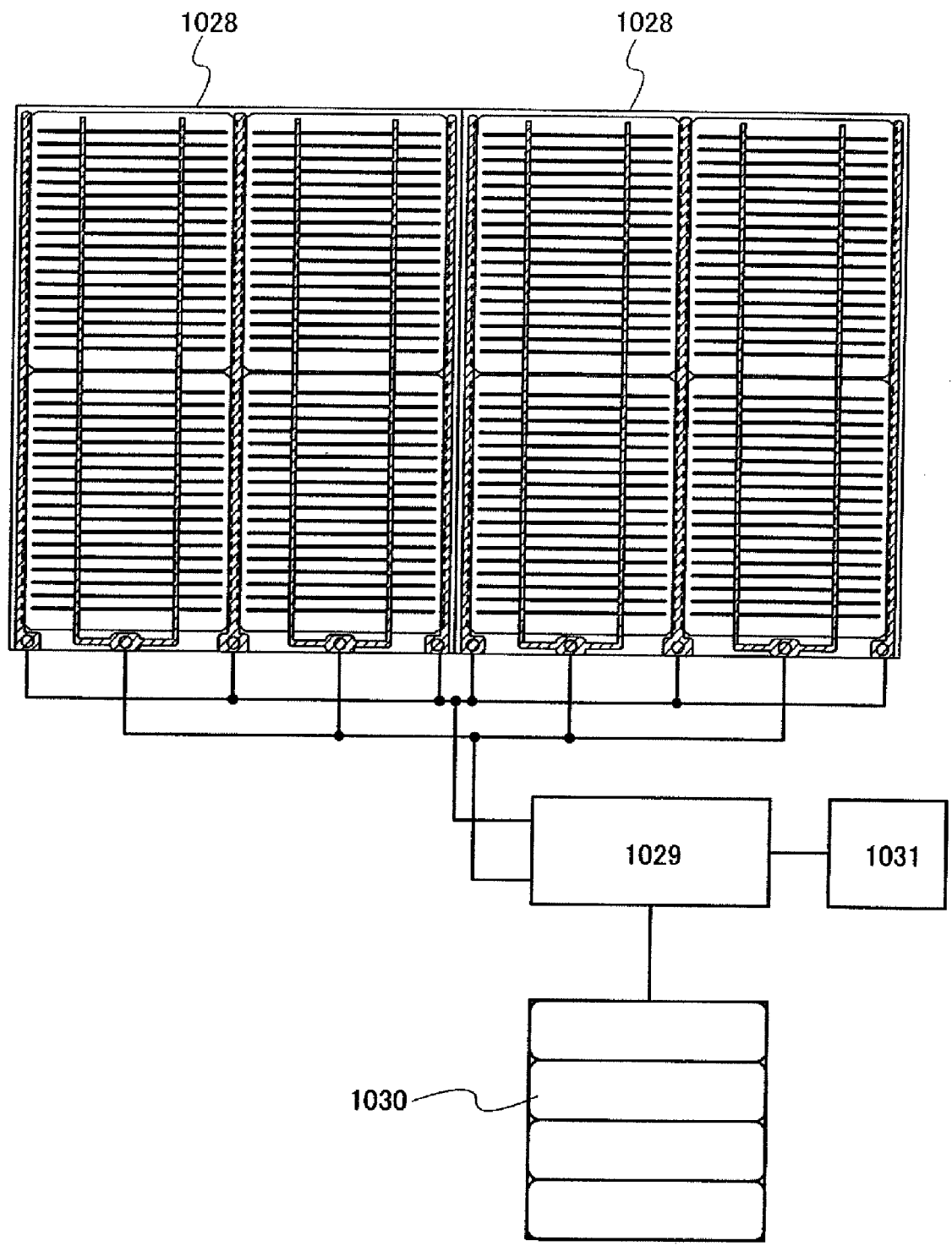
FIG. 25 is a schematic diagram for illustrating an example of a photovoltaic power generation system.

FIG. 25 shows an example of a photovoltaic power generation system using the photovoltaic power generation module 1028 described in Embodiment Mode 7. The output power of one or a plurality of photovoltaic power generation modules 1028 charges a battery 1030 using a charge control circuit 1029. When the charged amount of the battery 1030 is large, the power is output directly to a load 1031 in some cases.

When an electric double layer capacitor is used as the battery 1030, the battery can be charged rapidly without chemical reaction in charging. In addition, compared with a lead storage battery or the like which uses chemical reaction, lifetime can be increased by about eight times and charging and discharging efficiency can be increased by 1.5 times. As the load 1031, a lighting apparatus such as a fluorescent lamp, a light emitting diode, or an electroluminescent panel; a small electronic appliance; or the like can be given. In this manner, the photovoltaic power generation module using the photoelectric conversion device of the present invention can be used in a variety of applications.

Note that this embodiment mode can be combined with any of the other embodiment modes, as appropriate.

This application is based on Japanese Patent Application serial no. 2007-310817 filed with Japan Patent Office on Nov. 30, 2007, the entire contents of which are hereby incorporated by reference.

What is claimed is:

1. A method of manufacturing a photoelectric conversion device, comprising:
   forming a fragile layer in a region at a depth of less than 1000 nm from one surface of a single crystal semiconductor substrate, and forming a first impurity semiconductor layer, a first electrode, and an insulating layer on the one surface side;
   after bonding the insulating layer to a supporting substrate, separating the single crystal semiconductor substrate with the fragile layer or vicinity of the fragile layer used as a separation plane, thereby forming a first single crystal semiconductor layer over the supporting substrate;
   forming a second single crystal semiconductor layer by epitaxially growing a semiconductor layer on the first single crystal semiconductor layer by a plasma chemical vapor deposition method using a silane based gas and hydrogen with a flow rate 50 times or more that of the silane based gas as a source gas;
   forming a second impurity semiconductor layer having a conductivity type opposite to that of the first impurity semiconductor layer, over the second single crystal semiconductor layer; and
   forming a second electrode over the second impurity semiconductor layer.

2. The method of manufacturing a photoelectric conversion device according to claim 1, wherein the fragile layer is formed by using ions or cluster ions generated from a source gas including hydrogen.

3. The method of manufacturing a photoelectric conversion device according to claim 2, wherein the single crystal semiconductor substrate is irradiated with the ions or the cluster ions in such a manner that generated ions are accelerated by voltage without mass separation.

4. The method of manufacturing a photoelectric conversion device according to claim 2, wherein the ions or the cluster ions comprise $H_3^+$ ions.

5. The method of manufacturing a photoelectric conversion device, according to claim 1, wherein a thickness of the first single crystal semiconductor layer is in a range from 5 nm to 300 nm, and a thickness of the second single crystal semiconductor layer is in a range from 100 nm to 2000 nm.

6. The method of manufacturing a photoelectric conversion device, according to claim 1,
   wherein the first single crystal semiconductor layer is formed to have p type conductivity by using a p type single crystal semiconductor substrate as the single crystal semiconductor substrate, and
   wherein the second single crystal semiconductor layer is formed to be intrinsic by epitaxially growing the first single crystal semiconductor layer.

7. The method of manufacturing a photoelectric conversion device, according to claim 6,
   wherein the first impurity semiconductor layer has p type conductivity, while the second impurity semiconductor layer has n type conductivity.

8. The method of manufacturing a photoelectric conversion device, according to claim 1, wherein the silane based gas is silane or disilane.

9. The method of manufacturing a photoelectric conversion device, according to claim 1, wherein the source gas includes a rare gas.

10. The method of manufacturing a photoelectric conversion device, according to claim 1, wherein an apparatus which carries out the plasma chemical vapor deposition method has a pressure in a chamber between 1 Pa and $10^3$ Pa.

11. A method of manufacturing a photoelectric conversion device, comprising:
    forming a fragile layer in a region at a depth of less than 1000 nm from one surface of a single crystal semiconductor substrate, and forming a first impurity semiconductor layer, a first electrode, and an insulating layer on the one surface side;
    after bonding the insulating layer to a supporting substrate, separating the single crystal semiconductor substrate with the fragile layer or vicinity of the fragile layer used as a separation plane, thereby forming a first single crystal semiconductor layer over the supporting substrate;

forming a second single crystal semiconductor layer by epitaxially growing a semiconductor layer on the first single crystal semiconductor layer by a plasma chemical vapor deposition method using a silane based gas and hydrogen with a flow rate 50 times or more that of the silane based gas as a source gas;

forming a second impurity semiconductor layer by epitaxially growing a semiconductor layer on the second single crystal semiconductor layer by a plasma chemical vapor deposition method using a silane based gas, hydrogen with a flow rate 50 times or more that of the silane based gas, and a doping gas including an impurity element imparting a conductivity type as a source gas; and forming a second electrode over the second impurity semiconductor layer.

12. The method of manufacturing a photoelectric conversion device according to claim 11, wherein diborane or phosphine is used as the doping gas.

13. The method of manufacturing a photoelectric conversion device according to claim 11, wherein the fragile layer is formed by using ions or cluster ions generated from a source gas including hydrogen.

14. The method of manufacturing a photoelectric conversion device according to claim 13, wherein the single crystal semiconductor substrate is irradiated with the ions or the cluster ions in such a manner that generated ions are accelerated by voltage without mass separation.

15. The method of manufacturing a photoelectric conversion device according to claim 13, wherein the ions or the cluster ions comprise $H_3^+$ ions.

16. The method of manufacturing a photoelectric conversion device, according to claim 11, wherein a thickness of the first single crystal semiconductor layer is in a range from 5 nm to 300 nm, and a thickness of the second single crystal semiconductor layer is in a range from 100 nm to 2000 nm.

17. The method of manufacturing a photoelectric conversion device, according to claim 11, wherein the first single crystal semiconductor layer is formed to have p type conductivity by using a p type single crystal semiconductor substrate as the single crystal semiconductor substrate, and wherein the second single crystal semiconductor layer is formed to be intrinsic by epitaxially growing the first single crystal semiconductor layer.

18. The method of manufacturing a photoelectric conversion device, according to claim 17, wherein the first impurity semiconductor layer has p type conductivity, while the second impurity semiconductor layer has n type conductivity.

19. The method of manufacturing a photoelectric conversion device, according to claim 11, wherein the silane based gas is silane or disilane.

20. The method of manufacturing a photoelectric conversion device, according to claim 11, wherein the source gas includes a rare gas.

21. The method of manufacturing a photoelectric conversion device, according to claim 11, wherein an apparatus which carries out the plasma chemical vapor deposition method has a pressure in a chamber between 1 Pa and $10^3$ Pa.

* * * * *